(12) United States Patent
Guo et al.

(10) Patent No.: US 10,446,220 B1
(45) Date of Patent: Oct. 15, 2019

(54) SENSE AMPLIFIER WITH LOWER OFFSET AND INCREASED SPEED

(71) Applicant: Micron Technology, Inc., Boise, ID (US)

(72) Inventors: Xinwei Guo, Folsom, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/957,790

(22) Filed: Apr. 19, 2018

(51) Int. Cl.
*G11C 11/22* (2006.01)
*G11C 11/4091* (2006.01)
*G11C 7/08* (2006.01)
*G11C 16/26* (2006.01)
*G11C 16/08* (2006.01)
*G11C 7/06* (2006.01)

(52) U.S. Cl.
CPC .......... *G11C 11/4091* (2013.01); *G11C 7/065* (2013.01); *G11C 7/08* (2013.01); *G11C 11/2253* (2013.01); *G11C 16/08* (2013.01); *G11C 16/26* (2013.01)

(58) Field of Classification Search
CPC ..................................................... G11C 11/22
USPC ........................................................ 365/145
See application file for complete search history.

(56) References Cited

U.S. PATENT DOCUMENTS

| 5,270,967 | A  | * | 12/1993 | Moazzami | G11C 11/22 365/145 |
| 2008/0084773 | A1 | * | 4/2008 | Madan | G11C 11/22 365/202 |
| 2010/0091547 | A1 | * | 4/2010 | Ogiwara | G11C 11/22 365/145 |
| 2010/0097839 | A1 | * | 4/2010 | Kim | G11C 7/18 365/145 |
| 2010/0246238 | A1 | * | 9/2010 | Taylor | G11C 7/1006 365/145 |
| 2012/0069623 | A1 | * | 3/2012 | Miyakawa | G11C 11/22 365/145 |
| 2012/0307545 | A1 | * | 12/2012 | McAdams | G11C 11/221 365/145 |

* cited by examiner

*Primary Examiner* — Min Huang
(74) *Attorney, Agent, or Firm* — Holland & Hart LLP

(57) ABSTRACT

Methods and apparatus for sensing a memory cell using lower offset, higher speed sense amplifiers are described. A sense amplifier may include an amplifier component that is configurable to operate in an amplifier mode or a latch mode. In some examples, the amplifier component may be configured to operate in the amplifier or latch mode by activating or deactivating switching components inside the amplifier component. When configured to operate in the amplifier mode, the amplifier component may be used, during a read operation of a memory cell, to pre-charge a digit line and/or amplify a signal received from the memory cell. When configured to operate in the latch mode, the amplifier component may be used to latch a state of the memory cell. In some cases, the amplifier component may use some of the same internal circuitry for pre-charging the digit line, amplifying the signal, and/or latching the state.

22 Claims, 18 Drawing Sheets

SENSE AMPLIFIER WITH LOWER OFFSET AND INCREASED SPEED

BACKGROUND

The following relates generally to memory systems and more specifically to sense amplifiers with lower offset and higher speed for sensing memory cells.

Memory devices are widely used to store information in various electronic devices such as computers, wireless communication devices, cameras, digital displays, and the like. Information is stored by programming different states of a memory device. For example, binary memory devices have two logic states, often denoted by a logic "1" or a logic "0." In other memory devices, more than two logic states may be stored. To access the stored information, a component of the electronic device may read, or sense, the stored logic state in the memory device. To store information in a memory cell of a memory device, a component of the electronic device may write, or program, the logic state in the memory cell.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Approaches for improving memory devices may include increasing memory cell density, increasing read/write speeds, increasing reliability, increasing data retention, reducing power consumption, or reducing manufacturing costs, among other metrics. In some cases, various circuit components may be included in a sense amplifier for sensing and latching a logic state of a memory cell. Some such components may limit the speed of memory read operations and/or increase the size or power consumption associated with the sense amplifier.

DETAILED DESCRIPTION

Figure 1:
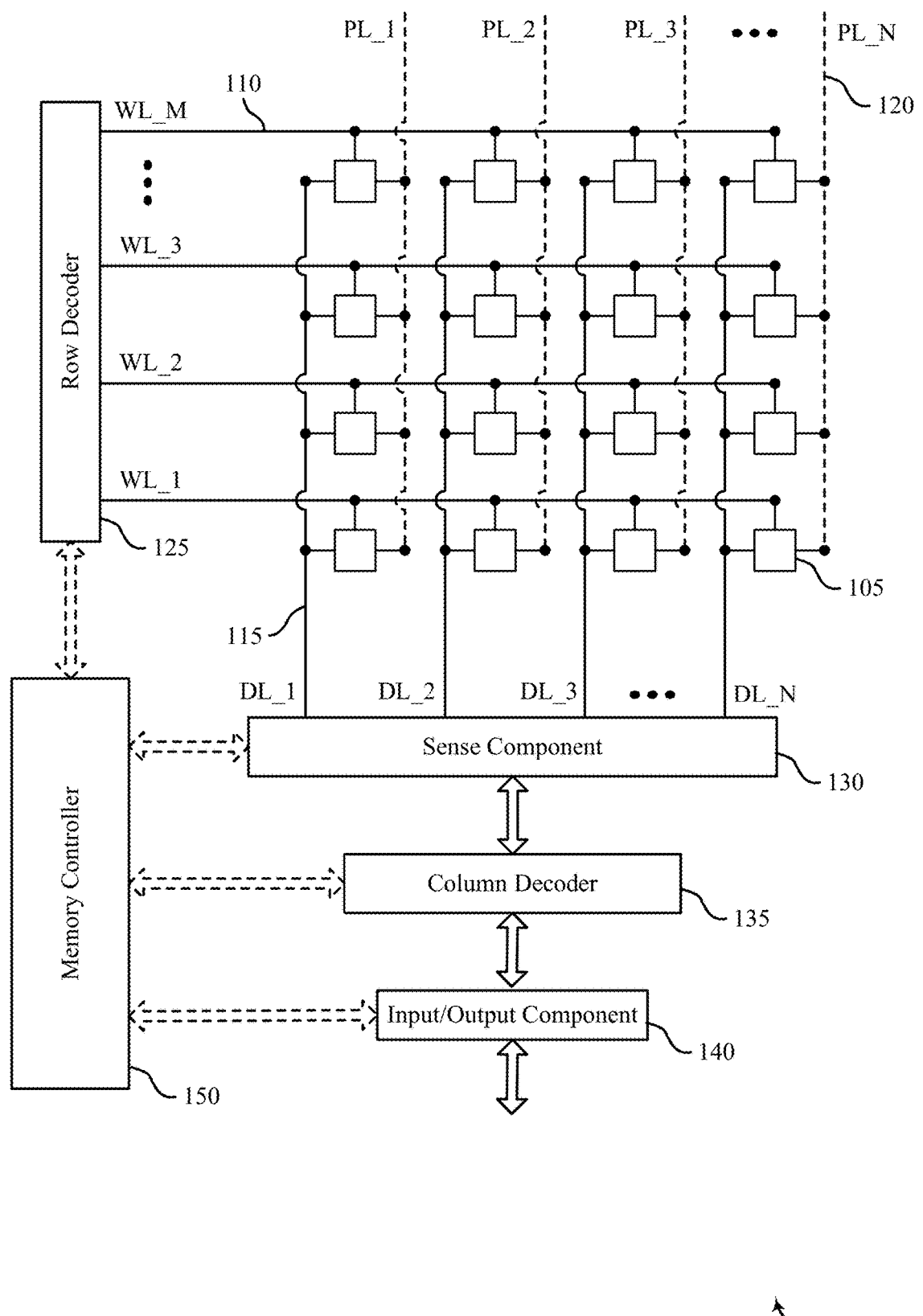
FIG. 1 illustrates an example memory device that supports sense amplifiers with lower offset and higher speed for sensing memory cells in accordance with examples of the present disclosure.

The logic state of a memory cell may be detected using a read operation that employs various schemes (e.g., those related to a sense amplifier) for sensing and latching the logic state of memory cells in accordance with aspects of the present disclosure. For example, a memory device may include a sense amplifier that is coupled with a memory cell to sense and latch the logic state of the memory cell. The state of the memory cell may then be provided to other circuitry in the memory device and transmitted to other components.

In some cases, a memory device may include a cascode device to pre-charge a digit line during a read operation before coupling a memory cell with the digit line, and/or to couple the digit line with an amplifier during signal development. However, a cascode device used in this manner may operate in a sub-threshold regime, which may introduce noise into the read operation (e.g., via the digit line). As described herein, alternative schemes for pre-charging a digit line and/or sensing and latching the state of a memory cell may provide advantages relative to approaches based on the use of a cascode or other approaches, by potentially speeding up the latch operation and reducing the amount of latch circuitry required In some cases, a sense amplifier may include an amplifier component that may be configurable (e.g., using switching components in the amplifier component) to operate in either an amplifier mode (e.g., to operate in a manner similar to a differential amplifier or other type of amplifier) or a latch mode (e.g., to operate in a manner similar to a latch circuit).

When the amplifier component is configured to operate in the amplifier mode, it may be able to aid in pre-charging the digit line to an initial sense voltage (instead of, for example, using a cascode device for pre-charging the digit line). In the amplifier component mode, the amplifier component may also be able to aid in amplifying the signal received from the memory cell.

When the amplifier component is configured in the latch mode, it may be able to aid in latching the state of the memory cell (e.g., in addition to or instead of using a separate latch circuit).

Using the same amplifier component for multiple functions as described above may have several benefits relative to, for example, a cascode-based implementation. For example, using the amplifier component both to pre-charge the digit line to an initial sensing voltage and to latch the state may increase the speed at which the state can be latched by compensating for the voltage offset introduced by the amplifier component during the signal development, thereby enabling the latch trigger point to track the developing signal more closely. In addition, re-using transistors and other circuitry in the amplifier component for multiple, distinct functions may eliminate the need for separate latch circuitry (in some examples), thereby potentially reducing the area and power consumption associated with the memory device.

Figure 2:
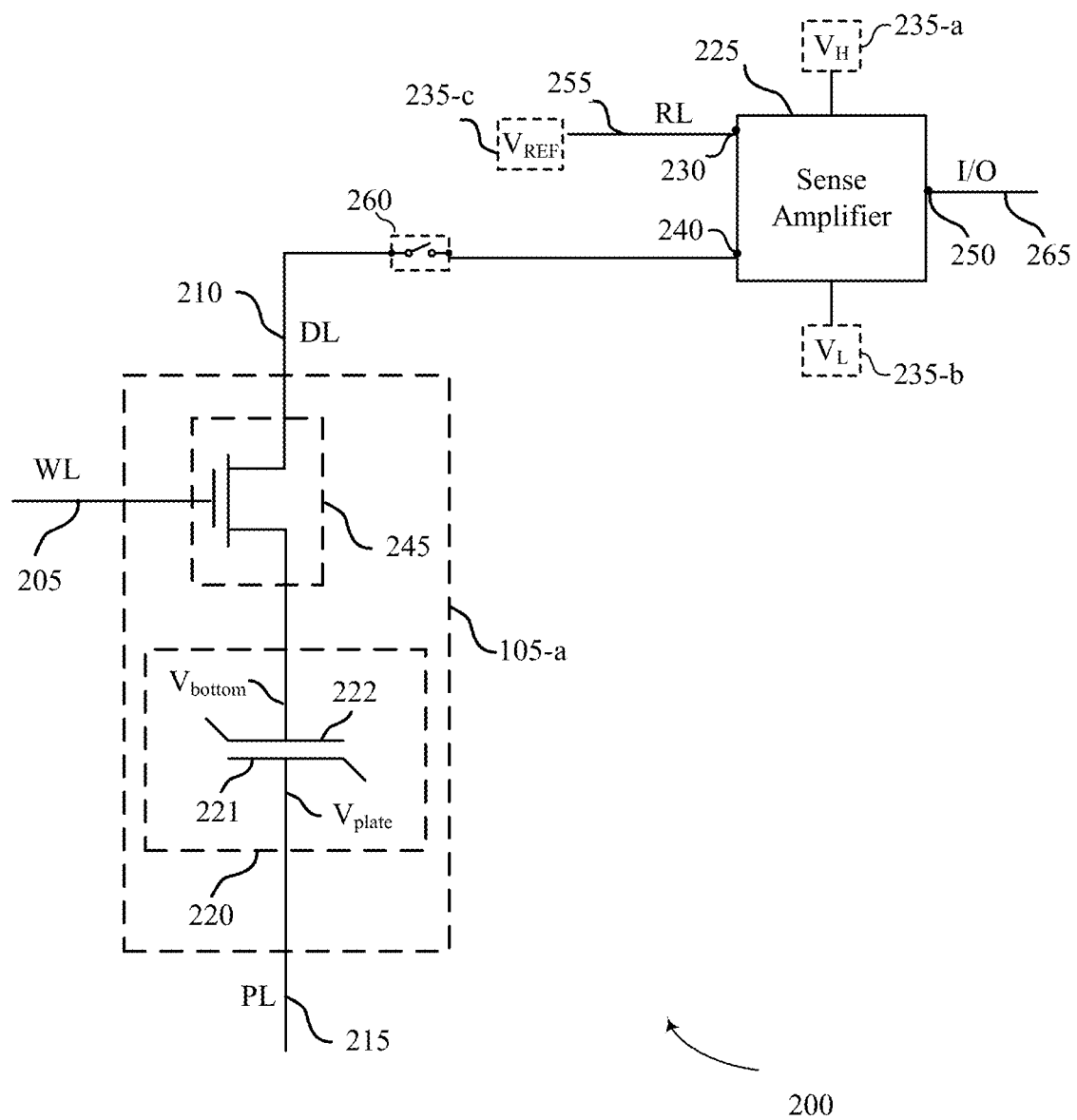
FIG. 2 illustrates an example circuit that supports sense amplifiers with lower offset and higher speed for sensing memory cells in accordance with examples of the present disclosure.
Figure 3:
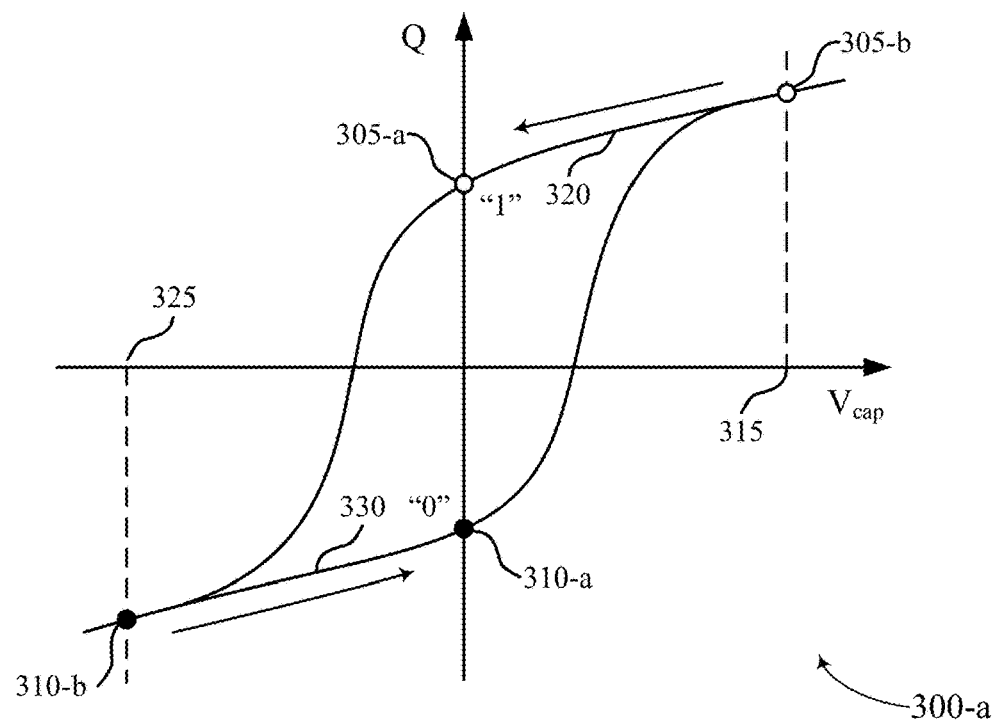
FIG. 3 illustrates an example of non-linear electrical properties with hysteresis plots for a memory cell that supports sense amplifiers with lower offset and higher speed for sensing memory cells in accordance with examples of the present disclosure.
Figure 3:
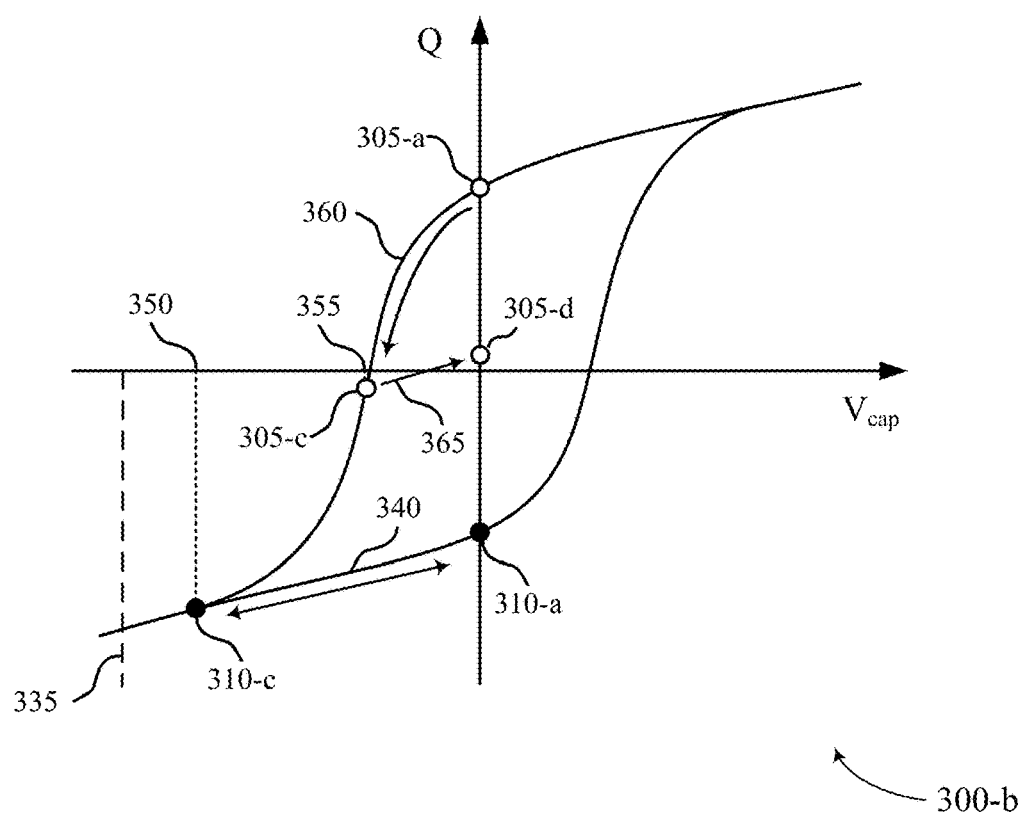

Features of the disclosure introduced above are further described with respect to FIGS. 1 through 3 in the context of memory arrays, memory circuits, and memory cell behaviors that support sense amplifiers for sensing memory cells with lower offset and higher speed. Specific examples are then described with respect to FIGS. 4-14, which illustrate circuits and associated read operation timing diagrams that support sense amplifiers with lower offset and higher speed for sensing memory cells. These and other features of the disclosure are further described with respect to FIGS. 15-18, which illustrate apparatus diagrams, system diagrams, and flowcharts that support sense amplifier schemes for sensing memory cells.

FIG. 1 illustrates an example memory device 100 that supports sense amplifiers with lower offset and higher speed for sensing memory cells in accordance with various examples of the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In various examples, the memory cells 105 may include a capacitive memory element, a ferroelectric memory element, a resistive element, or a self-selecting memory element.

In some examples, a memory cell 105 may store an electric charge representative of the programmable logic states (e.g., storing charge in a capacitor). In one example, a charged and uncharged capacitor may represent two logic states, respectively. In another example, a positively and negatively charged capacitor may represent two logic states, respectively. DRAM or FeRAM architectures may use such designs, and the capacitor employed may include a dielectric material with linear or para-electric electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that is substantially crystalline) may have a relatively low electrical resistance, and may alternatively be referred to as a "SET" logic state. A more-amorphous state of the material (e.g., an entirely amorphous state, some distribution of relatively small crystal grains that is substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, self-selecting memory may enhance differences in a threshold voltage of the memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 is coupled with one of a plurality of first access lines 110 (e.g., a word line (WL), such as one of WL_1 through WL_M), and each column of memory cells 105 is coupled with one of a plurality of second access lines 115 (e.g., a digit line (DL), such as one of DL_1 through DL_N). In some cases, first access lines 110 and second access lines 115 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 110 and an access line 115. This intersection may be referred to as an address of a memory cell 105. A target memory cell 105 may be a memory cell 105 located at the intersection of an energized or otherwise selected access line 110 and an energized or otherwise selected access line 115. In other words, an access line 110 and an access line 115 may be energized or otherwise selected to access (e.g., read, write) a memory cell 105 at their intersection. Other memory cells 105 that are in electronic communication with (e.g., connected to) the same access line 110 or 115 may be referred to as untargeted memory cells 105.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the logic storing component (e.g., a capacitive memory element, a ferroelectric memory element, a resistive memory element, other memory element) of a memory cell 105 may be electrically isolated from a second access line 115 by a cell selection component. A first access line 110 may be coupled with and may control the cell selection component of the memory cell 105. For example, the cell selection component may be a transistor and the first access line 110 may be coupled with a gate of the transistor. Activating the first access line 110 of a memory cell 105 may result in an electrical connection or closed circuit between the logic storing component of the memory cell 105 and its corresponding second access line 115. The second access line 115 may then be accessed to read or write the memory cell 105.

In some examples, memory cells 105 may also be coupled with one of a plurality of third access lines 120 (e.g., a plate line (PL), such as one of PL_1 through PL_N). In some examples, the plurality of third access lines 120 may couple memory cells 105 with one or more voltage sources for various sensing and/or writing operations including those described herein. For example, when a memory cell 105 employs a capacitor for storing a logic state, a second access line 115 may provide access to a first terminal of the capacitor, and a third access line 120 may provide access to a second terminal of the capacitor (e.g., a terminal associated with an opposite plate of the capacitor as opposed to the first terminal of the capacitor, a terminal otherwise on the opposite side of a capacitance from the first terminal of the capacitor). Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, or a current to the respective access line. Access lines 110, 115, and 120 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples, a memory cell 105 may be accessed by activating a first access line 110 and a second access line 115.

In some examples, the memory controller 150 may control the operation (e.g., read operations, write operations, rewrite operations, refresh operations, discharge operations) of memory cells 105 through the various components (e.g. row decoder 125, column decoder 135, sense component 130). In some cases, one or more of the row decoder 125, column decoder 135, and sense component 130 may be co-located or otherwise included with the memory controller 150. The memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read (e.g., sensed) by a sense component 130 when the memory cell 105 is accessed (e.g., in cooperation with the memory controller 150) to determine a logic state stored by the memory cell 105. For example, the sense component 130 may be configured to sense a current or charge through the memory cell 105, or a voltage resulting from coupling the memory cell 105 with the sense component 130 or other intervening component responsive to a read operation. The sense component 130 may provide an output signal indicative of the logic state stored by the memory cell 105 to one or more components (e.g., to the column decoder 135, the input/output component 140, the memory controller 150).

In some examples, after accessing the memory cell 105, the logic storage portion of memory cell 105 may discharge, or otherwise permit electrical charge or current to flow via its corresponding access line 115. Such charge or current may result from biasing, or applying a voltage, to the memory cell 105 from one or more voltage sources or supplies (not shown) of the memory device 100, where such voltage sources or supplies may be part of the sense component 130, the memory controller 150, or some other component (e.g., a biasing component). In some examples, a discharge of a memory cell 105 may cause a change in the voltage of the access line 115, which the sense component 130 may compare to a reference voltage to determine the stored state of the memory cell 105. In some examples, a discharge of a memory cell 105 may cause a change in the voltage of an amplifier capacitor (not shown) that is coupled with access line 115, and the sense component 130 may compare the voltage across the amplifier capacitor with a reference voltage to determine the stored state of the memory cell 105.

A sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, a difference between a read charge and a reference charge). In some examples, a sense component 130 may include a collection of components (e.g., circuit elements) that may be repeated for each of a set of access lines 115 connected to the sense component 130. For example, a sense component 130 may include a separate sensing circuit (e.g., a separate sense amplifier, and/or a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of the memory device 100 (e.g., shared among one or more sense components 130, shared among separate sensing circuits of a sense component 130).

The sense component 130 may be included in a device that includes the memory device 100. For example, the sense component 130 may be included with other read and write circuits, decoding circuits, or register circuits of the memory that may be coupled with the memory device 100. In some examples, the detected logic state of a memory cell 105 may be output through a column decoder 135 as an output. In some examples, a sense component 130 may be part of a column decoder 135 or a row decoder 125. In some examples, a sense component 130 may be connected to or otherwise in electronic communication with a column decoder 135 or a row decoder 125.

Although a single sense component 130 is shown, a memory device 100 may include more than one sense component 130. For example a first sense component 130 may be coupled with a first subset of access lines 115 and a second sense component 130 may be coupled with a second subset of access lines 115 (e.g., different from the first subset of access lines 115). In some examples, such a division of sense components 130 may support parallel (e.g., simultaneous) operation of multiple sense components 130.

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 110, second access line 115, and/or third access line 120. In other words, a logic state may be stored in the memory cell 105. Column decoder 135 or row decoder 125 may accept data, for example via input/output component 140, to be written to the memory cells 105.

In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding the ferroelectric memory element). In the case of PCM, a memory element may be written by applying a current with a profile that causes (e.g., by way of heating and cooling) the memory element to form an atomic configuration associated with a desired logic state.

In various examples in accordance with the present disclosure, a sense amplifier may be provided, such as a sense amplifier within sense component 130, to support lower offset and higher speed sensing of signals to determine and latch a logic state stored by a memory cell 105. The sense amplifier may, in some examples, include an amplifier component that may be configurable (e.g., using switching components inside the amplifier component) to operate in multiple different modes. By including a sense amplifier having a configurable amplifier component such as those described herein, the memory device 100 may support particular techniques for sensing and latching a logic state stored by a memory cell 105 with a lower offset and higher speed, such as those described with respect to FIGS. 4-14.

The described implementations of a sense amplifier having a configurable amplifier component may enable faster and more accurate latching of a state of a memory cell. Further, the described implementations of a sense amplifier having a configurable amplifier component may support a smaller memory cell footprint (e.g., supporting fewer components such as fewer transistors and fewer or smaller latches), may support faster access operations, and/or may provide other benefits including those described herein.

FIG. 2 illustrates a simplified example circuit 200 that supports sense amplifiers with lower offset and higher speed for sensing memory cells in accordance with various examples of the present disclosure. Circuit 200 may include a memory cell 105-a and a sense amplifier 225, which may be examples of a memory cell 105 and a sense component 130 (or a portion of a sense component 130) described with reference to FIG. 1. Circuit 200 may also include a word line 205, a digit line 210, and a plate line 215, which, in some examples, may correspond to a first access line 110, a second access line 115, and a third access line 120, respectively, as described with reference to FIG. 1. The circuit 200 may also include a reference line 255 that may be used by sense amplifier 225 a to determine a stored logic state of the memory cell 105-a.

As illustrated in FIG. 2, the sense amplifier 225 may include a first input node 230 and a second input node 240, which in various examples may be coupled with different access lines of a circuit (e.g., with digit line 210 and reference line 255 of circuit 200, respectively). Other configurations of access lines and/or reference lines, however, are possible in accordance with various examples of the present disclosure. In some examples, deactivating switching component 260 isolates sense amplifier 225 from the digit line 210.

Sense amplifier 225 may be coupled with one or more voltage sources 235. In some examples, sense amplifier 225 may be coupled with voltage source 235-a that provides a high voltage (e.g., a voltage of $V_H$, which may be set to a supply voltage such as $V_{SS}$). In some examples, sense amplifier 225 may be coupled with voltage source 235-b that provides a low voltage (e.g., a voltage of $V_L$, which may be a ground voltage substantially equal to $V_0$ or a negative voltage). In some examples, sense amplifier 225 may be coupled with a reference voltage source 235-c that provides a reference voltage $V_{REF}$ that is used to determine a logic state of memory cell 105-a.

In some examples, digit line 210 and/or sense amplifier 225 may be coupled with a pre-charge voltage source (not shown) that is used to pre-charge digit line 210 to a first voltage. In some examples, digit line 210 and/or sense amplifier 225 may be coupled with a sense voltage source (not shown) that is used to pre-charge digit line 210 to a second voltage using an amplifier component in sense amplifier 225. In some examples, a single variable voltage source may be configured to selectively provide some or all of a reference voltage, a pre-charge voltage, and a sense voltage.

Memory cell 105-a a may include a logic storage component (e.g., a memory element), such as capacitor 220 that has a first plate (e.g., cell plate 221), and a second plate (e.g., cell bottom 222). The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage Vplate, and cell bottom 222 may be associated with a voltage Vbottom, as illustrated in the circuit 200. In some examples, the orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various states may be stored by charging, discharging, and/or polarizing the capacitor 220.

The capacitor 220 may be in electronic communication with the digit line 210, and the stored logic state of capacitor 220 may be read or sensed by operating various elements represented in circuit 200. For example, the memory cell 105-a a may also include a cell selection component 245, and the capacitor 220 can be coupled with digit line 210 when cell selection component 245 is activated (e.g., by way of an activating logical signal), and the capacitor 220 can be isolated from digit line 210 when cell selection component 245 is deactivated (e.g., by way of a deactivating logical signal).

In some examples, activating the cell selection component 245 may be referred to as selecting the memory cell 105-a, and deactivating the cell selection component 245 may be referred to as deselecting the memory cell 105-a. In some examples, the cell selection component 245 may be or include a transistor and its operation may be controlled by applying an activation voltage to the transistor gate, where the voltage for activating the transistor (e.g., the voltage between the transistor gate terminal and the transistor source terminal) may be greater than the threshold voltage magnitude of the transistor. The word line 205 may be used to activate the cell selection component 245. For example, a selection voltage applied to the word line 205 (e.g., a word line logical signal) may be applied to the gate of a transistor of cell selection component 245, which may connect the capacitor 220 with the digit line 210 (e.g., providing a conductive path between the capacitor 220 and the digit line 210).

In other examples, the positions of the cell selection component 245 and the capacitor 220 in the memory cell 105-a may be switched, such that cell selection component 245 is coupled with or between the plate line 215 and the cell plate 221, and the capacitor 220 is coupled with or between the digit line 210 and the other terminal of the cell selection component 245. In such an example, the cell selection component 245 may remain in electronic communication with the digit line 210 through the capacitor 220. This configuration may be associated with alternative timing and biasing for access operations.

In example memory cells that employ a capacitor 220 that is a ferroelectric capacitor, the capacitor 220 may or may not fully discharge upon connection to the digit line 210. In various schemes, to sense the logic state stored by a ferroelectric capacitor 220, a voltage may be applied to the plate line 215 and/or the digit line 210, and the word line 205 may be biased to select the memory cell 105-a. In some cases, the plate line 215 and/or the digit line 210 may be virtually grounded and then isolated from the virtual ground, which may be referred to as a floating condition, prior activating the word line 205.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by a sense amplifier 225 (e.g., in sense component 130) to determine the stored logic state of the memory cell 105-a.

The resulting voltage of the digit line 210 after selecting the memory cell 105-a may be compared to a reference (e.g., a voltage of reference line 210, $V_{REF}$, which may be supplied by voltage source 235-c) by the sense amplifier 225 to determine the logic state that was stored in the memory cell 105-a. In some cases, sense amplifier 225 may include an amplifier capacitor (not shown) that is configured to be selectively coupled with digit line 210 to enable electric charge to be transferred between memory cell 105-a and the amplifier capacitor during a read operation. In this case, sense amplifier 225 may compare the voltage of the amplifier capacitor with the voltage of reference line 255 to determine the logic state of the memory cell.

Other operations may be used to support selecting and/or sensing the memory cell 105-a, including operations for supporting sense amplifiers (e.g., sense amplifier 225) with lower offset and higher speed for sensing memory cells as described herein.

Sense amplifier 225 may include various transistors or amplifiers to pre-charge the digit line 210 during a pre-charging portion of a read operation, to detect and amplify a difference in signals during a signal development portion of the read operation, to determine a state of the memory cell based on the difference in the signals, and to latch the state, which may include storing the state within the sense amplifier 225 itself or within a latch circuit that is external to the sense amplifier. In some examples, sense amplifier 225 may include an amplifier component (not shown) that is configurable to operate in different modes during various portions of a read operation.

In some cases, the state may be output from the sense amplifier at an output node 250 via one or more input/output (I/O) lines (e.g., I/O line 265), which may include an output through a column decoder 135 via input/output component 140 described with reference to FIG. 1.

The circuit 200, including the sense amplifier 225 and the cell selection component 245, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor (s) may be formed on a substrate that is dedicated to a particular component of the circuit 200 (e.g., a substrate for the sense component 130 a, a substrate for the amplifier component 280, a substrate for the memory cell 105-a), or the transistor(s) may be formed on a substrate that is common for particular components of the circuit 200 (e.g., a substrate that is common for the sense component 130 a and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

FIG. 3 illustrates an example of non-linear electrical properties, as depicted in hysteresis plots 300 a and 300 b, of certain memory cells that may be sensed using sense amplifier with lower offset and increased speed in accordance with various aspects of the present disclosure. The hysteresis plots 300 a and 300 b may illustrate an example writing process and reading process, respectively, for a memory cell 105 employing a ferroelectric capacitor 220 as described with reference to FIG. 2. The hysteresis plots 300-a and 300-b depict the charge, Q, stored on the ferroelectric capacitor 220 as a function of a voltage difference Vcap, between the terminals of the ferroelectric capacitor 220 (e.g., when charge is permitted to flow into or out of the ferroelectric capacitor 220 according to the voltage difference Vcap). For example, the voltage difference Vcap may represent the difference in voltage between a digit line side of the capacitor 220 and a plate line side of the capacitor 220 (e.g., Vbottom–Vplate).

A ferroelectric material is characterized by a spontaneous electric polarization, where the material may maintain a non-zero electric charge in the absence of an electric field. Examples of ferroelectric materials include barium titanate (BaTiO3), lead titanate (PbTiO3), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220.

Additionally, it should be understood that the voltages in the hysteresis plots 300 a and 300 b represent a voltage difference across the capacitor (e.g., between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference Vcap across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference Vcap shown in the hysteresis plots 300 a and 300 b.

As depicted in the hysteresis plot 300 a, a ferroelectric material used in a ferroelectric capacitor 220 may maintain a positive or negative polarization when there is no net voltage difference between the terminals of the ferroelectric capacitor 220. For example, the hysteresis plot 300 a illustrates two possible polarization states, a charge state 305 a and a charge state 310 b, which may represent a positively saturated polarization state and a negatively saturated polarization state, respectively. The charge states 305 a and 310 a may be at a physical condition illustrating remnant polarization (Pr) values, which may refer to the polarization (or charge) that remains upon removing the external bias (e.g., voltage). The coercive voltage is the voltage at which the charge (or polarization) is zero. According to the example of the hysteresis plot 300-*a*, the charge state 305-*a* may represent a logic 0 when no voltage difference is applied across the ferroelectric capacitor 220, and the charge state 310-*a* may represent a logic 1 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-*b* is reached (e.g., writing a logic 0).

Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-*b* and the charge state 305-*a* at zero voltage across the capacitor. Similarly, voltage 325 may be a voltage equal to or lesser than a negative saturation voltage, and applying the voltage 325 across the ferroelectric capacitor 220 results in charge accumulation until the charge state 310-*b* is reached (e.g., writing a logic 1). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-*b* and the charge state 310 *a* at zero voltage across the capacitor. In some examples, the voltage 315 and the voltage 325, representing saturation voltages, may have the same magnitude, but opposite polarity.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether the charge state 305-*a* or the charge state 310-*a* was initially stored, among other factors.

The hysteresis plot 300-*b* illustrates an example of reading of stored charge states 305-*a* and 310-*a*. A read voltage 335 may be applied, for example, as a voltage difference via a digit line 210 and a plate line 215 as described with reference to FIG. 2. The hysteresis plot 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a cell selection component 245 as described with reference to FIG. 2). Upon applying the read voltage 335 to the ferroelectric capacitor 220, charge may flow into or out of the ferroelectric capacitor 220 via the digit line 210 and plate line 215, and different charge states may result depending on whether the ferroelectric capacitor 220 was at the charge state 305-*a* (e.g., a logic 1) or at the charge state 310-*a* (e.g., a logic 0).

When performing a read operation on a ferroelectric capacitor 220 at the charge state 310-*a* (e.g., a logic 0), additional negative charge may accumulate across the ferroelectric capacitor 220, and the charge state may follow path 340 until reaching the charge and voltage of the charge state 310-*c*. The amount of charge flowing through the capacitor 220 may be related to the intrinsic capacitance of the digit line 210 (e.g., intrinsic capacitance 240 described with reference to FIG. 2).

Accordingly, as shown by the transition between the charge state 310-*a* and the charge state 310-*c*, the resulting voltage 350 may be a relatively large negative value due to the relatively large change in voltage for the given change in charge. Thus, upon reading a logic 0 in a "plate high" read operation, the digit line voltage, equal to the sum of VPL and the value of (Vbottom−Vplate) at the charge state 310-*c*, may be a relatively low voltage. Such a read operation may not change the remnant polarization of the ferroelectric capacitor 220 that stored the charge state 310 *a*, and thus after performing the read operation the ferroelectric capacitor 220 may return to the charge state 310-*a* via path 340 when the read voltage 335 is removed (e.g., by applying a zero net voltage across the ferroelectric capacitor 220). Thus, performing a read operation with a negative read voltage on a ferroelectric capacitor 220 with a charge state 305-*a* may be considered a non-destructive read process.

When performing the read operation on the ferroelectric capacitor 220 at the charge state 305-*a* (e.g., a logic 1), the stored charge may reverse polarity as a net negative charge accumulates across the ferroelectric capacitor 220, and the charge state may follow the path 360 until reaching the charge and voltage of the charge state 305-*c*. The amount of charge flowing through the capacitor 220 may again be related to the intrinsic capacitance of the digit line 210 (e.g., intrinsic capacitance 240 described with reference to FIG. 2). Accordingly, as shown by the transition between the charge state 305-*a* and the charge state 305-*c*, the resulting voltage 355 may be a relatively small negative value due to the relatively small change in voltage for the given change in charge. Thus, upon reading a logic 1 in a "plate high" read operation, the digit line voltage, equal to the sum of VPL and the value of (Vbottom−Vplate) at the charge state 310-*c*, may be a relatively high voltage.

In various examples, a read operation with a negative read voltage (e.g., read voltage 335) may result in a reduction or a reversal of remnant polarization of the capacitor 220 that stored the charge state 305 *a*. In other words, according to the properties of the ferroelectric material, after performing the read operation the ferroelectric capacitor 220 may not return to the charge state 305 *a* when the read voltage 335 is removed (e.g., by applying a zero net voltage across the capacitor 220). Rather, when applying a zero net voltage across the ferroelectric capacitor 220 after a read operation with read voltage 335, the charge state may follow path 365 from the charge state 305 *c* to the charge state 305 *d*, illustrating a net reduction in polarization magnitude (e.g., a less positively polarized charge state than initial charge state 305 *a*). Thus, performing a read operation with a negative read voltage on a ferroelectric capacitor 220 with a charge state 305-*a* may be a destructive read process. However, in some sensing schemes, a reduced remnant polarization may still be read as the same stored logic state as a saturated remnant polarization state (e.g., supporting detection of a logic 1 from both the charge state 305-*a* and the charge state 305-*d*), thereby providing a degree of non-volatility for a memory cell 105 with respect to read operations.

The transition from the charge state 305-*a* to the charge state 305-*d* may be illustrative of a sensing operation that is associated with a partial reduction and/or partial reversal in polarization of a ferroelectric capacitor 220 of a memory cell 105 (e.g., a reduction in the magnitude of charge Q from the charge state 305-*a* to the charge state 305-*d*). In various examples, the amount of change in polarization of a ferroelectric capacitor 220 of a memory cell 105—as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at the charge state 305 *a* may result in a full reversal of polarization, with the ferroelectric capacitor 220 transitioning from the charge state 305-*a* to the charge state 310-*a* after the sensing operation.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, amplifier capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of the digit line 210 and may be determined through a load-line analysis. In other words, the charge states 305-*c* and 310-*c* may be defined with respect to the net capacitance of the digit line 210. As a result, the voltage of the ferroelectric capacitor 220 after initiating a read operation (e.g., voltage 350 when reading the ferroelectric capacitor 220 that stored the charge state 310-*a*, voltage 355 when reading the ferroelectric capacitor 220 that stored the charge state 305-*a*), may be different and may depend on the initial state of the ferroelectric capacitor 220.

The initial state of the ferroelectric capacitor 220 may be determined by comparing the voltage of a digit line 210 (or a related voltage, such as the voltage across an amplifier capacitor) resulting from the read operation with a reference voltage (e.g., via a reference line 255 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-*a*, or voltage 355 when reading the ferroelectric capacitor 220 having a stored the charge state 305-*a*). In some examples, the digit line voltage may be the difference between the read voltage 335 and the final voltage across the capacitor 220 (e.g., (read voltage 335–voltage 350) when reading the ferroelectric capacitor 220 having a stored the charge state 310-*a*, (read voltage 335–voltage 355) when reading the ferroelectric capacitor 220 having a stored the charge state 305-*a*).

In some sensing schemes, a reference voltage may be generated such that the reference voltage is between the possible voltages that may result from reading different logic states. For example, a reference voltage may be selected to be lower than the resulting digit line voltage when reading a logic 1, and higher than the resulting digit line voltage when reading a logic 0. In other examples, a comparison may be made at a portion of a sense component 130 that is different from a portion where a digit line is coupled, and therefore a reference voltage may be selected to be lower than the resulting voltage at the comparison portion of the sense component 130 when reading a logic 1, and higher than the resulting voltage at the comparison portion of the sense component 130 when reading a logic 0. During comparison by the sense component 130, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of digit line voltage from one memory cell to the next (e.g., resulting voltage 350 may vary from reading one memory cell 105 to the next), and reading a logic 0 may be associated with different levels of digit line voltage from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference," and having a low minimum read voltage difference may be associated with difficulties in reliably sensing the logic states of memory cells in a given memory device.

To reliably detect the logic state of a plurality of memory cells 105 that are subject to manufacturing and operational variations, a sense component 130 may be designed to employ self-referencing techniques, where a memory cell 105 itself is involved in providing a reference signal when reading the memory cell 105. However, when using the same memory cell 105 for providing both a sense signal and a reference signal, the sense signal and the reference signal may be substantially identical when performing access operations that do not change a state stored by the memory cell 105. For example, when performing a self-referencing read operation on a memory cell 105 storing a logic 1 (e.g., storing a charge state 310 a), a first access operation that may include applying the read voltage 335 may follow path 340, and a second operation that may also include applying the read voltage 335 may also follow path 340, and the first and second access operations may result in substantially the same access signals (e.g., from the perspective of the memory cell 105). In such cases, when employing a sense component 130 that relies on a difference between a sense signal and a reference signal to detect a logic state stored by the memory cell 105, some other portion of a memory device may provide such a difference in the event that access operations might provide substantially equal sense and reference signals.

Figure 4:
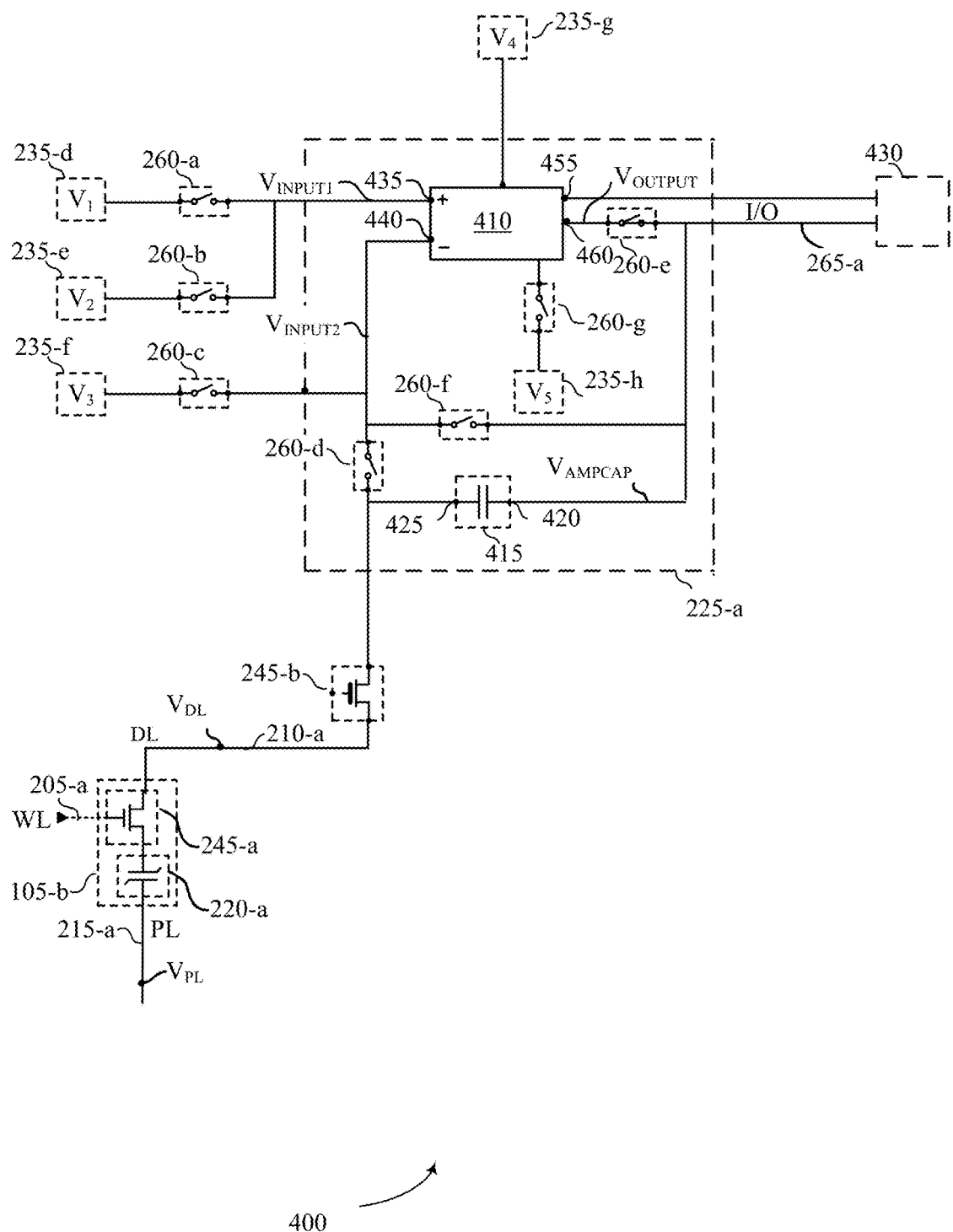
FIG. 4 illustrates an example of a circuit that supports sense amplifiers with lower offset and higher speed for sensing memory cells in accordance with examples of the present disclosure.

FIG. 4 illustrates an example of a circuit 400 that supports sense amplifiers with lower offset and higher speed for sensing memory cells in accordance with various examples of the present disclosure. The circuit 400 may include a memory cell 105-b, a sense amplifier 225-a (e.g., in a sense component 130) for sensing a logic state of the memory cell 105-b, and optional latch circuit 430 for storing a sensed logic state of memory cell 105-b. The memory cell 105-b and the sense amplifier 225-a may be examples of the respective components described with reference to FIGS. 1 and 2.

The circuit 400 may include a word line 205-a, a digit line 210-a, and a plate line 215-a. Each of the word line 205-a, the digit line 210-a, and the plate line 215-a may be coupled with one or more memory cells 105, including the memory cell 105-b as shown. The digit line 210-a and the plate line 215-a may be associated with voltages $V_{DL}$ and $V_{PL}$, respectively, as shown. The circuit 400 may include the word line 205-a for selecting or deselecting the memory cell 105-b (e.g., by way of logic signal WL). The circuit 400 may include the plate line 215-a for accessing a cell plate of a capacitor 220-a of the memory cell 105-b. Thus, the memory cell 105-b may represent a memory cell coupled with or between a first access line (e.g., the digit line 210-a) and a second access line (e.g., the word line 205-a).

Sense amplifier 225-a may include amplifier component 410 and amplifier capacitor 415. Sense amplifier 225-a may further include switching components 260-d, 260-e, 260-f for selectively coupling various nodes of amplifier component 410 and amplifier capacitor 415 with, for example, digit line 210-a, I/O line 265-a, and/or other nodes of amplifier component 410 and amplifier capacitor 415. Circuit 400 may include one or more additional switching components (e.g., switching components 260-a, 260-b, 260-c, 260-g) for coupling and uncoupling amplifier component 410 and/or digit line 210-a with various voltage sources 235.

Amplifier component 410 may have a first input 435, a second input 440, a first output 455, and a second output 460. In some cases, the first input 435 may be referred to as a positive input. In some cases, the second input 440 may be referred to as a negative input or feedback input. First output 455 may be an inverse of second output 460; that is, a voltage or current that is output by amplifier component 410 at second output 460 may be the opposite polarity of a voltage or current that is output by amplifier component at first output 455.

The circuit 400 may include a variety of voltage sources 235, which may be coupled with various voltage supplies and/or common grounding or virtual grounding points of a memory device that may include the example circuit 400.

A voltage source 235-g may represent an amplifier component 410 high voltage source, and may be associated with a voltage V4. A voltage source 235-h may represent an amplifier component 410 low voltage source or supply voltage, and may be associated with a voltage V5. The voltage source 235-g may be coupled with a first supply node of the amplifier component 410. The voltage source 235-h may be selectively coupled with a second supply node of the amplifier component 410 via a switching component 260-f.

In some examples, the amplifier component 410 may be supplied with a positive voltage and a negative voltage via the voltage sources 235-g and 235-h. As one example, V4 may be selected to be equal to 1.0V and V5 may be selected to be equal to −0.5V. In some cases, amplifier component 410 may be coupled with one or more additional voltage supplies (not shown).

The first and second inputs 435, 440 of amplifier component 410 may be selectively coupled with one or more voltage sources 235-d, 235-e, 235-f via switching components 260-a, 260-b, and 260-c, respectively.

In some cases, voltage source 235-d may be associated with voltage V1, which may be a sense voltage $V_{SENSE}$. In some cases, voltage source 235-e may be associated with voltage V2, which may be a reference voltage $V_{REF}$. In some cases, voltage source 235-f may be associated with voltage V3, which may be a pre-charge voltage $V_{PRE}$. In some cases, the pre-charge voltage may be the same as the sense voltage. In some cases, one or more of voltage sources 235-d, 235-e, 235-f are selectable voltage sources such that a single voltage source may take the place of two or more of voltage sources 235-d, 235-e, 235-f.

In some examples, the sense amplifier 225-a may be in electronic communication with a memory controller (not shown), such as a memory controller 150 described with reference to FIG. 1, which may control various operations of the sense amplifier 225-a and/or of amplifier component 410.

In some examples, the amplifier component 410 may be configurable (e.g., via activating or deactivating various switching components (not shown) inside amplifier component 410) to operate in an amplifier mode. As one example, when amplifier component 410 is configured to operate in an amplifier mode, a voltage or current at the first output 455 and second output 460 of the amplifier component may be proportional to a difference in voltage or current between the first input 435 and the second input 440 of the amplifier component.

In some examples, the amplifier component 410 may be configurable (e.g., via activating or deactivating various switching components inside the amplifier component 410) to operate in a latch mode. As one example, when amplifier component 410 is configured to operate in a latch mode and amplifier component 410 is activated, amplifier component 410 may determine a state of the memory cell and latch the state. In some examples, amplifier component 410 may latch the state by outputting the state to a latch circuit 430 (e.g., a latch circuit exterior to the amplifier component 410), which may store the state and subsequently output the state to one or more other components. In some examples, the amplifier component 410 may latch the state by storing the state using transistors (not shown) within amplifier component 410 itself, and may subsequently output the state (e.g., via I/O line 265-*a*) to other components or circuits. In other words, in some cases, amplifier component 410 may be configurable to perform functions similar to a separate latch circuit 430, thereby eliminating the need for latch circuit 430.

In the example of circuit 400, sense amplifier 225-*a* includes an amplifier capacitor 415, which may have a first node 420 associated with a voltage of $V_{AMPCAP}$ and a second node 425 that is coupled with digit line 210-*a* via selection component 245-*b*. In some examples, second node 425 of amplifier capacitor 415 may, during portions of a read operation, reach a voltage that is essentially the same as $V_{DL}$.

In the example of circuit 400, the sense amplifier 225-*a* may include a switching component 260-*e* that may be used to selectively couple or decouple the second output 460 of the amplifier component 410 with the first node 420 of the amplifier capacitor 415 (e.g., by activating or deactivating switching component 260-*e*). In this case, the sense amplifier 225-*a* illustrates an example of including an amplifier component 410 with a capacitive feedback line (e.g., via the capacitance of the amplifier capacitor 415) that may be selectively enabled or disabled (e.g., by activating or deactivating switching component 260-*e*).

In the example of circuit 400, sense amplifier 225-*a* includes a switching component 260-*f*, which may be used to selectively couple or decouple the second output 460 of amplifier component 410 with the second input 440 of amplifier component 410 (e.g., by activating or deactivating switching component 260-*f*). In other words, sense amplifier 225-*a* may include an amplifier component 410 having a direct feedback line that may be selectively enabled or disabled (e.g., via the switching component 260-*f*).

The circuit 400 may include other switching components or selection components to selectively couple or uncouple amplifier component 410 and/or amplifier capacitor 425 with access lines 210 for various access operations. For example, the circuit 400 may include a selection component 260-*d* to support selectively coupling or uncoupling the memory cell 105-*b* with amplifier component 410 (e.g., via digit line 210-*a*) and/or with amplifier capacitor 415. Circuit 400 includes digit line selection component 245-*b* that may be used for coupling and uncoupling digit line 210-*a* with sense amplifier 225-*a*.

The amplifier component 410 and/or optional latch circuit 430 may, in some examples, be used to latch signals associated with a read operation when detecting a logic state stored by a memory cell 105-*b*. Electrical signals associated with such latching may be communicated between the sense amplifier 225-*a*, optional latch circuit 430, and/or another input/output component 140 (not shown), for example, via I/O line 265-*a*. In some examples, the sense amplifier 225-*a* may be in electronic communication with a memory controller (not shown), such as a memory controller 150 described with reference to FIG. 1, which may control various operations of the sense amplifier 225-*a*.

Although the sense amplifier 225-*a*, amplifier component 410, latch circuit 430, switching components 260, selection component 260, and voltage sources 235 are illustrated with respective dashed lines as reflecting particular boundaries, such boundaries are shown for illustrative purposes only. In other words, any one or more of an amplifier component 410, latch circuit 430, switching components 260, or voltage sources 235 in accordance with the present disclosure may have boundaries different than the dashed boundaries shown in the circuit 400. For example, a sense amplifier 225-*a* or an amplifier component 410 may or may not include voltage sources or other voltage supplies, such that the voltage sources or voltage supplies may be within the illustrative boundaries or outside the illustrative boundaries.

Each of the components illustrated in circuit 400 (e.g., sense amplifier 225-*a*, switching components 260, selection components 245, amplifier component 410, latch circuit 430, voltage sources 235) may be controlled using signals provided by a memory controller (not shown), such as a memory controller 150 described with reference to FIG. 1. In some examples, certain logical signals, such as logical signal WL, may be provided by a memory controller or by other components. For example, logical signal WL may be provided by a row decoder (not shown), such as a row decoder 125 described with reference to FIG. 1.

Figure 5:
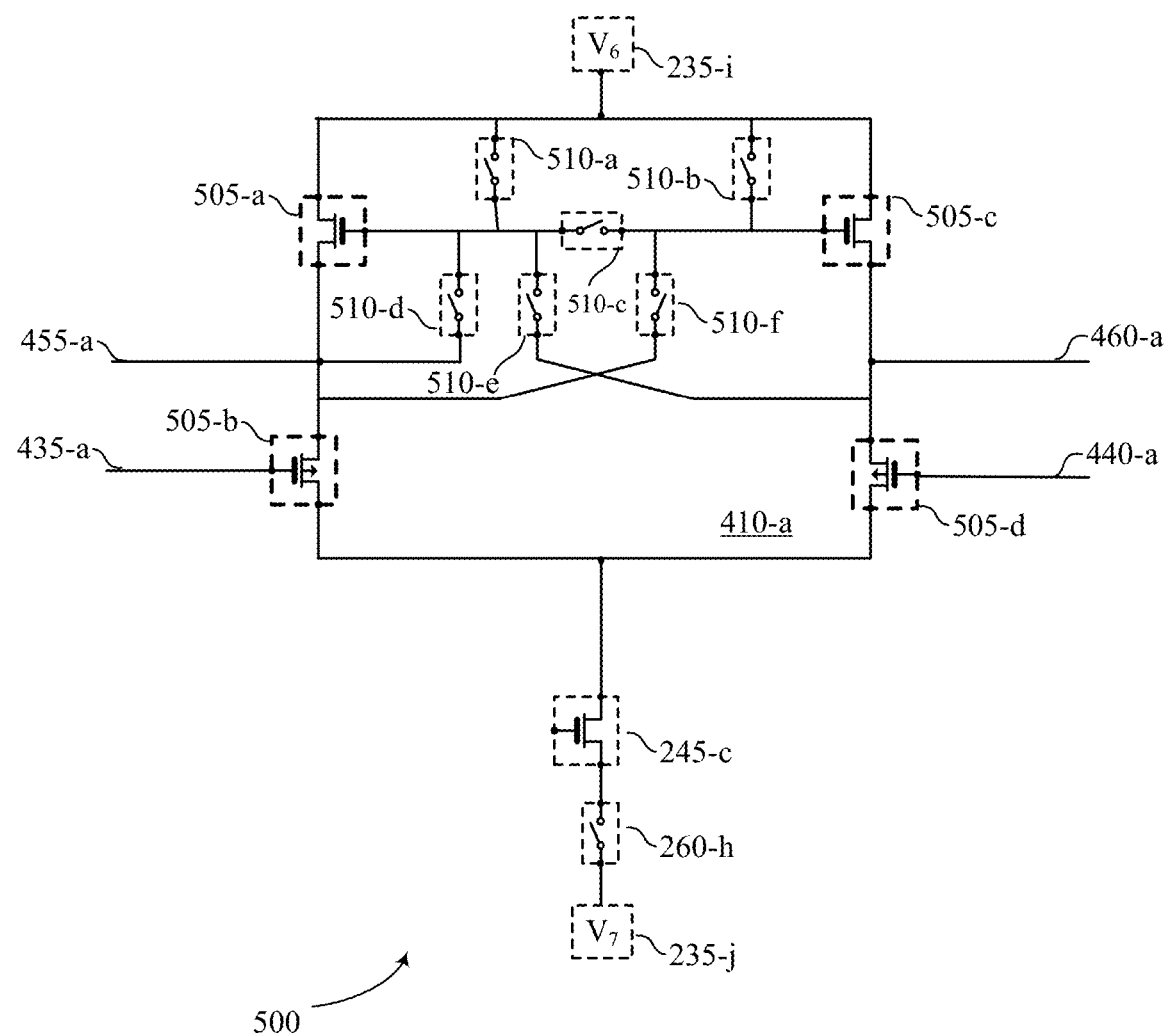
FIG. 5 illustrates an example of a circuit that supports sense amplifiers with lower offset and higher speed for sensing memory cells in accordance with examples of the present disclosure.

FIG. 5 illustrates an example of a circuit 500 that supports sense amplifiers with lower offsets and higher speeds for sensing memory cells in accordance with various examples of the present disclosure. Circuit 500 provides additional details with respect to the circuitry of a configurable amplifier component, such as amplifier component 410 described with respect to FIG. 4. Circuit 500 may depict an example of an amplifier component that is configurable to operate in an amplifier mode or in a latch mode. Circuit 500 may depict an example of an amplifier that is configurable to operate, in the latch mode, as a latch (e.g., a half latch).

Circuit 500 includes exemplary amplifier component 410-*a*. Amplifier component 410-*a* includes internal transistors 505 and internal switching components 510. In some examples, switching components 510 may include switching transistors, such as PMOS, NMOS, or CMOS switching transistors. In some cases, activating a switching component 510 includes supplying an activation signal to the switching component, such as applying an activation voltage to a gate of a switching transistor.

In some examples, transistors 505 may be MOS transistors. In some cases, transistors 505-*a* and 505-*c* may be PMOS transistors, and transistors 505-*b* and 505-*d* may be NMOS transistors. Other examples of amplifier component 410 may use other types of transistors.

Amplifier component 410-*a* is directly coupled with voltage source 235-*i*, and coupled with voltage source 235-*j* via switching component 260-*h* and selection component 245-*c*. In some examples, voltage source 235-*i* is associated with voltage V6, which may be a high voltage (e.g., $V_{HSA}$). In some examples, voltage source 235-*j* is associated with voltage V7, which may be a low voltage or supply voltage (e.g., $V_{SS}$). As depicted in FIG. 4, amplifier component may additionally be coupled with other high and low voltage supplies (e.g., 235-*g*, 235-*h*). Amplifier component 410-*a* may be activated by activating switching component 260-*h* and supply voltage selection component 245-*c* to couple amplifier component 410-*a* with voltage V7 (e.g., $V_{SS}$).

Amplifier component includes a first input 435-*a*, a second input 440-*a*, a first output 455-*a*, and a second output 460-*a*. In some examples, first input 435-*a* may be referred to as a positive input, and second input 440-*a* may be referred to as a negative input or feedback input.

Switching components 510 in amplifier component 410-*a* may be used to couple or uncouple various nodes of transistors 505 with each other and/or with inputs or outputs of amplifier component. For example, activating switching component 510-*d* may couple the gate of transistor 505-*a* with first output 455-*a*. Similarly, activating switching component 510-*c* may couple the gate of transistor 505-*a* with the gate of transistor 505-*c*, which may be a configuration used to implement a current mirror functionality. Conversely, deactivating switching component 510-*c* may uncouple the gate of transistor 505-*a* from the gate of transistor 505-*c*. Activating switches 510-*e* and 510-*f* cross-couples transistors 505-*a* and 505-*c*. This configuration may be used to implement a latch functionality.

Amplifier component 410-*a* may be configurable to operate in different modes (e.g., amplifier mode, latch mode) during different portions of a read operation of a memory cell by activating or deactivating various switching components 510. The operation of circuit 500 having amplifier component 410-*a*, including its operation while amplifier component 410-*a* is configured to operate in an amplifier mode or in a latch mode, is described in more detail with respect to FIGS. 6-11.

Figure 6:
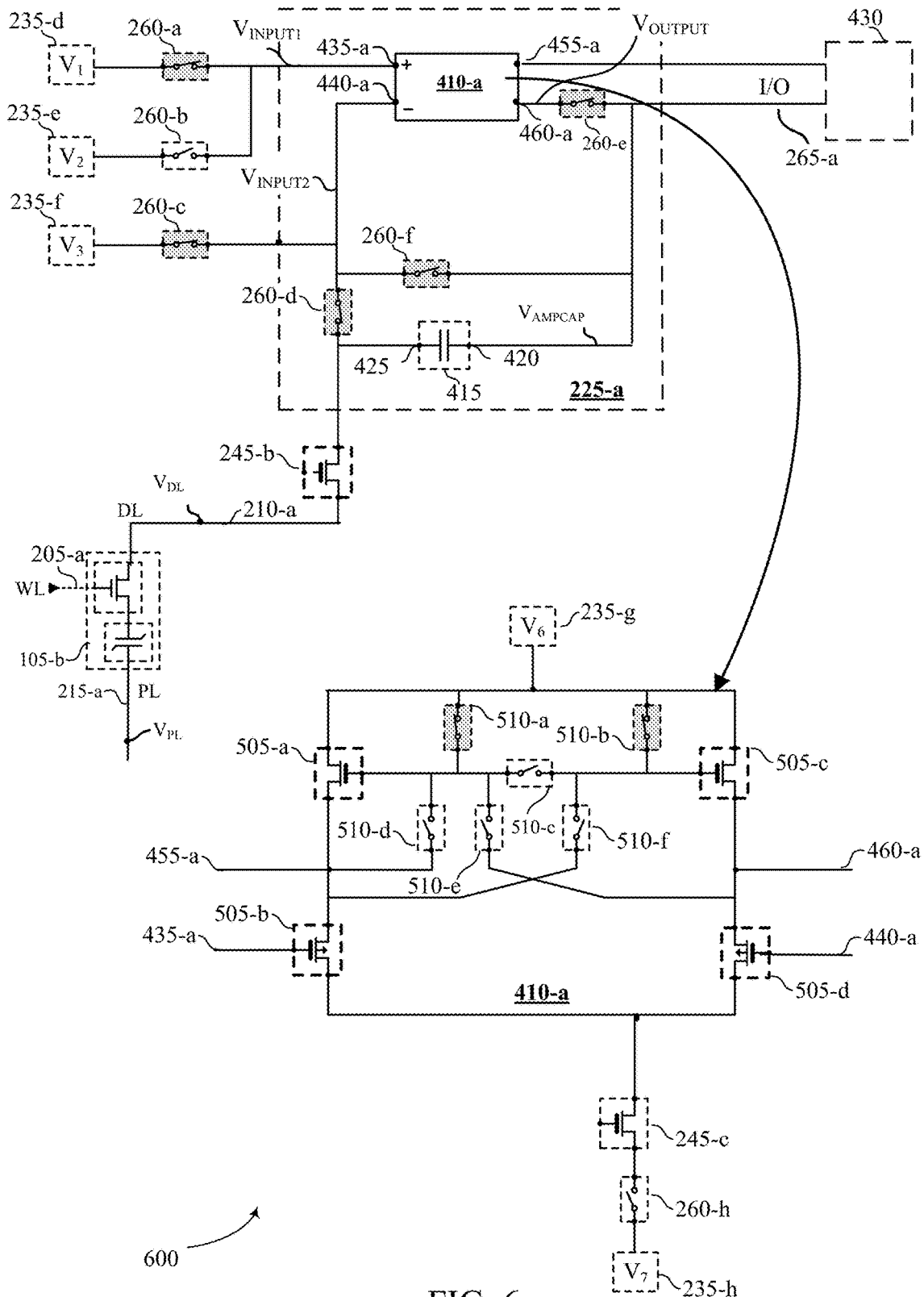
FIG. 6 illustrates an example of a circuit that supports sense amplifiers with lower offset and higher speed for sensing memory cells in accordance with examples of the present disclosure.

FIG. 6 illustrates an example of a circuit 600 that supports sense amplifiers with lower offsets and higher speeds for sensing memory cells in accordance with various examples of the present disclosure. Circuit 600 includes amplifier component 410-*a*, memory cell 105-*b*, sense amplifier 225-*a*, voltage sources 235, switching components 260, selection components 245, and optional latch circuit 430, as described with respect to FIGS. 4-5. Circuit 600 may be an example of a configuration of circuits 400 and 500 during a portion of a read operation.

In some cases, a read operation of a memory cell includes a pre-charging operation for pre-charging digit line 210-*a* to a voltage (e.g., a sense voltage) before coupling memory cell 105-*a* with digit line 210-*a* to enable more accurate sensing of the logic state of memory cell 105-*a*.

In some examples, a pre-charging operation may include a first pre-charging portion. During the first pre-charging portion, digit line 210-*a* may be pre-charged to a first voltage by activating switching components 260-*c* and 260-*d* along with digit line selection component 245-*b* to couple voltage source 235-*f* associated with voltage V3 (e.g., $V_{PRE}$) with digit line 210-*a*. The voltage of digit line 210-*a* may, in some examples, approach or reach voltage V3 during the first pre-charging portion.

In some cases, amplifier component 410-*a* may not be used during the first pre-charging portion of the read operation. Thus, in some cases, amplifier component 410-*a* may not be activated during the first pre-charging portion of the read operation because switching component 260-*h* may be deactivated and amplifier component 410-*a* may be uncoupled from voltage source 235-*j* (e.g., voltage supply $V_{SS}$). Internal switches 510-*a* and 510-*b* may be activated, and remaining internal switches 510-*c*, 510-*d*, 510-*e*, and 510-*f* may be deactivated.

Figure 7:
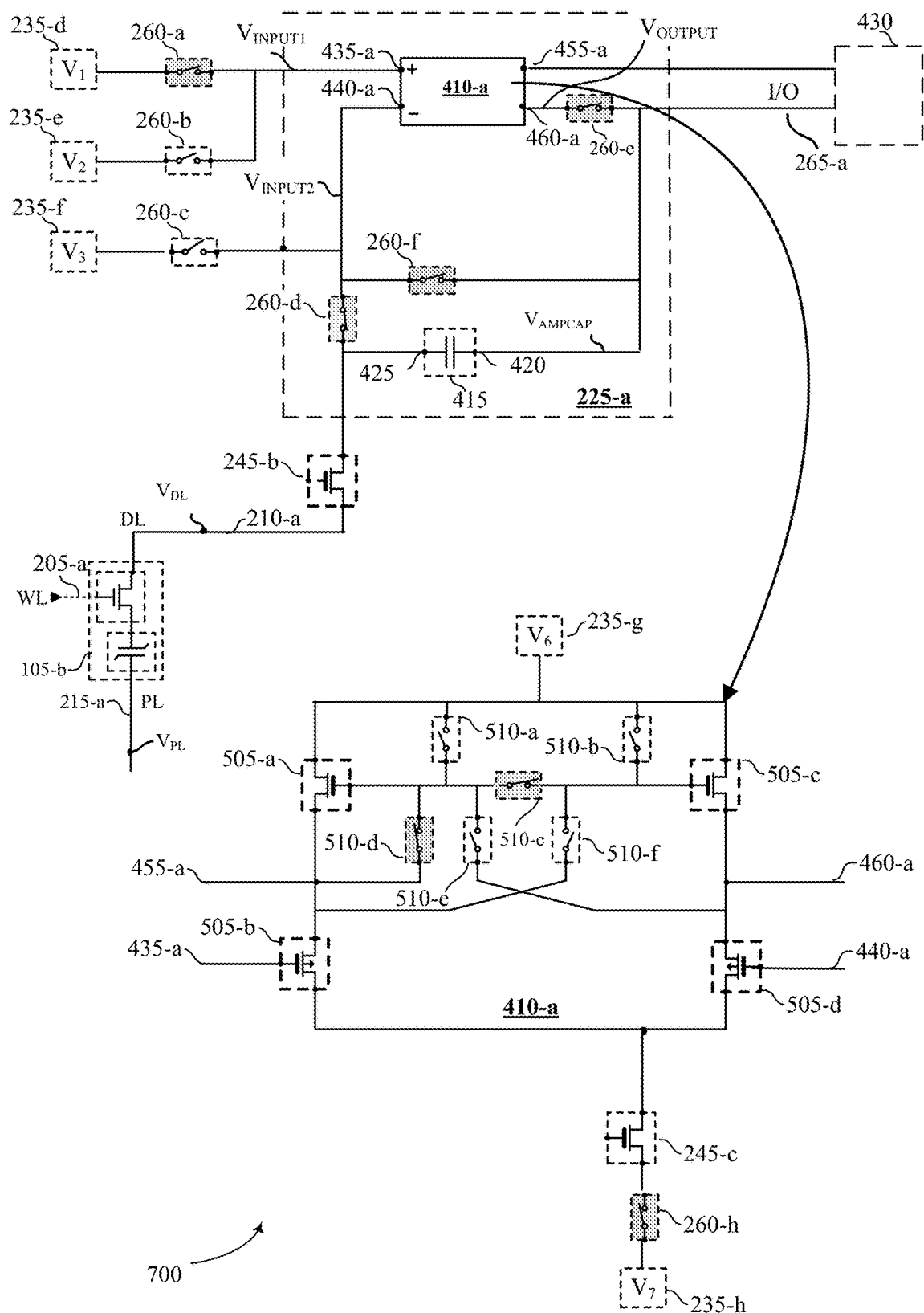
FIG. 7 illustrates an example of a circuit that supports sense amplifiers with lower offset and higher speed for sensing memory cells in accordance with examples of the present disclosure.

FIG. 7 illustrates an example of a circuit 700 that supports sense amplifiers with lower offsets and higher speeds for sensing memory cells in accordance with various examples of the present disclosure. Circuit 700 may be an example of a configuration of circuits 400 and 500 during a portion of a read operation.

As noted with respect to FIG. 6, in some cases, a read operation of a memory cell includes a pre-charging operation to pre-charge digit line 210-*a* to a sense voltage before coupling memory cell 105-*a* with digit line 210-*a* to enable more accurate sensing of the logic state of memory cell 105-*a*. Circuit 700 may be an example of circuits 400 and 500 as configured for operation during a second pre-charging portion of a read operation of a memory cell. In some cases, the second pre-charging portion may follow the first pre-charging portion described with respect to FIG. 6. In some cases, a memory device may perform the second pre-charging portion without performing the first pre-charging portion, or may perform the first pre-charging portion without performing the second pre-charging portion.

During the second pre-charging portion, the voltage of digit line 210-*a* may be changed from a first voltage (e.g., approximately $V_{PRE}$) to a second voltage, which may be referred to as an offset-adjusted sense voltage $V_{SENSEOFF}$.

In the example depicted in FIG. 7, amplifier component 410-*a* may be configured to operate in an amplifier mode by activating switching components 510-*d* and 510-*c*, and deactivating switching components 510-*e* and 510-*f*. In this configuration, transistors 505-*a* and 505-*b* may be configured to operate as a current mirror. Amplifier component 410-*a* may be activated by activating switching component 260-*h* and voltage supply selection component 245-*c*, thereby coupling amplifier component 410-*a* with voltage source 235-*h*, which may be a voltage supply (e.g., $V_{SS}$). Amplifier component 410-*a* may be uncoupled from voltage source 235-*g* by deactivating switching components 510-*a*, 510-*b*.

During the second pre-charging portion of the read operation, voltage source 235-*d* is coupled with first input 435-*a* of amplifier component 410-*a* by activating switching component 260-*a*, and a feedback path may be enabled from the second output 460-*a* and the second input 440-*a* of amplifier component 410-*a* by activating switching components 260-*e* and 260-*f*. In addition, digit line 210-*a* may be coupled with second input 440-*a* of amplifier component 410-*a*. Voltage source 235-*d* is associated with voltage V1, which may be a sense voltage (e.g., $V_{SENSE}$). In some examples, voltage V1 may be the same as voltage V3 (e.g., the pre-charge voltage and the sense voltage may be the same voltage). In other examples, voltage V1 may be different than (e.g., higher than, lower than) voltage V3.

During the second pre-charging portion of the read operation, while amplifier component 410-*a* may be configured in the amplifier mode, amplifier component 410-*a* may be used as a voltage buffer to adjust the voltage of digit line 210-*a* from a first voltage (e.g., the voltage to which the digit line was pre-charged in the first pre-charging portion, or another voltage) to a second voltage (e.g., $V_{SENSEOFF}$). The second voltage may be based on a difference between the voltage at the first input 435-*a* (e.g., $V_{INPUT1}$, which may be $V_{SENSE}$ during this portion) and the second input 440-*a* (e.g., $V_{INPUT2}$, which may be $V_{DL}$ during this portion), and may include the effect of a voltage offset of amplifier component 410-*a*. (Such a voltage offset may be a result of mismatched transistors in amplifier component 410-*a* due to process variations.) That is, using amplifier component 410-*a* to adjust the voltage of digit line 210-*b* from the first voltage to the second voltage during the second pre-charging portion may cause digit line 210-*b* to be pre-charged to an offset-adjusted voltage that may account for the effect of the voltage offset of amplifier component 410-*a*.

The above-described pre-charging process, as performed during the first pre-charging portion and/or the second pre-charging portion, may have several benefits in the context of sensing a memory cell. Among others, using a voltage source 235-*d* to pre-charge the digit line during the first pre-charging portion may allow the digit line 210-*b* to be quickly charged to a voltage that is close to the sense voltage and may reduce the DC current constraint on the amplifier component (as compared with performing the entire pre-charging process using the amplifier component, for example).

In addition, using the amplifier component in the second pre-charging portion to pre-charge the digit line to an offset-adjusted sense voltage may enable faster latching when the amplifier component is also used for amplifying the signal received from the memory cell and latching the state, as will be described in more detail with respect to FIGS. 8-10.

Figure 8:
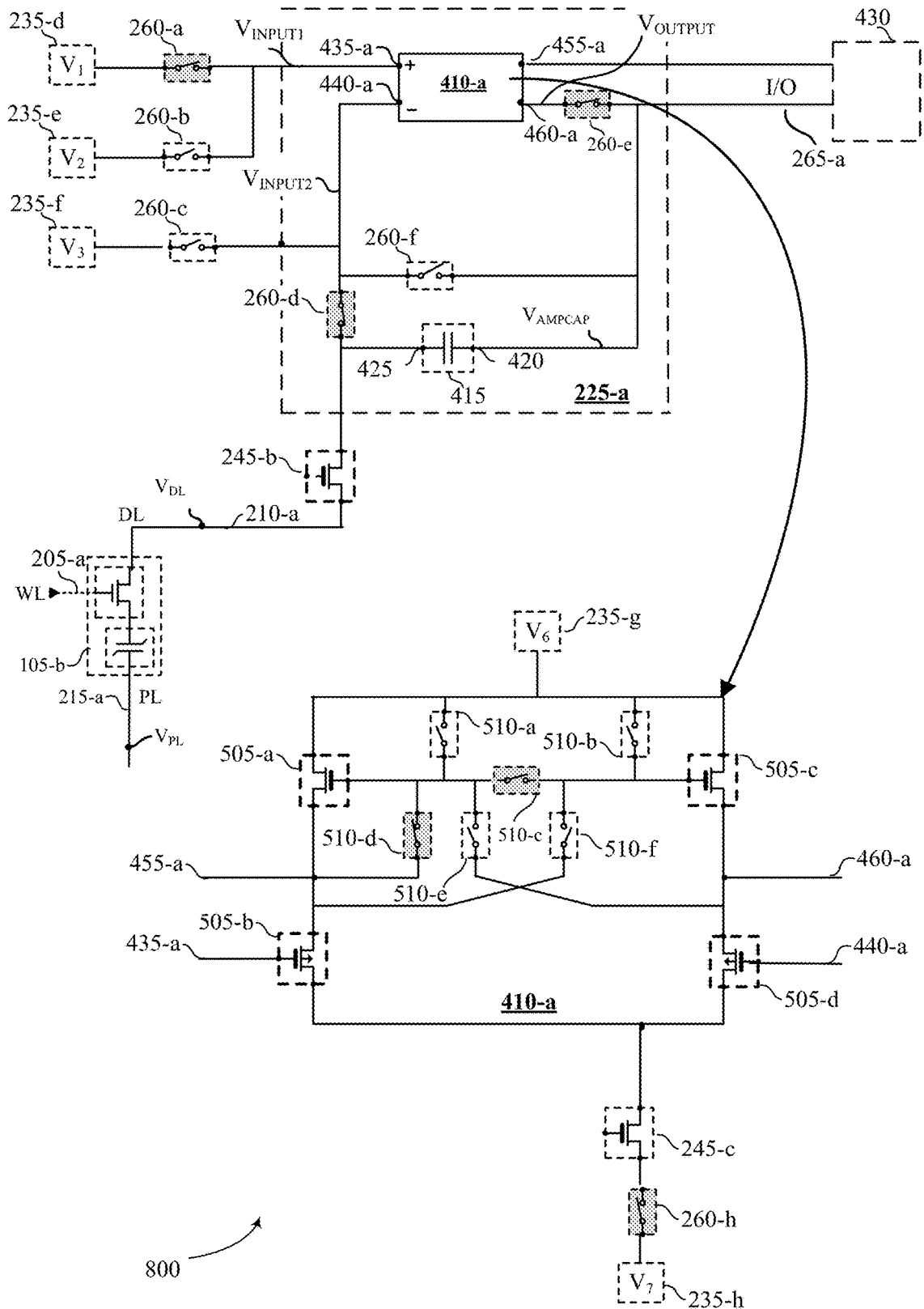
FIG. 8 illustrates an example of a circuit that supports sense amplifiers with lower offset and higher speed for sensing memory cells in accordance with examples of the present disclosure.

FIG. 8 illustrates an example of a circuit 800 that supports sense amplifiers with lower offsets and higher speeds for sensing memory cells in accordance with various examples of the present disclosure. Circuit 800 may be an example of a configuration of circuits 400 and 500 during a portion of a read operation.

In some cases, a read operation of a memory cell may include a signal development portion during which the memory cell (e.g., memory cell 105) is coupled with the digit line and is discharging its charge (e.g., from a ferroelectric capacitor 220) onto the digit line, thereby potentially changing the amount of charge on the digit line and/or the voltage of the digit line.

As depicted in FIG. 8, amplifier component 410-a may include amplifier capacitor 415 having a first node 420 and a second node 425. In some cases, during the signal development portion of the read operation, the first node 420 of amplifier capacitor 415 may be coupled with the second output 460-a of amplifier component by activating switching component 260-e. The second node 425 of amplifier capacitor 415 may be coupled with the digit line 210-a via activated selection component 245-b. The first input 435-a of amplifier component 410-a may be coupled with voltage source 235-d by activating switching component 260-a and deactivating switching component 260-b. Thus, the first input 435-a may be set to a sense voltage $V_{SENSE}$, while the second input 440-a may be set to the voltage of digit line 210-a (e.g., $V_{DL}$) by activating switching component 260-d.

During the signal development portion, the amplifier component 410-a may be configured to operate in an amplifier mode and may amplify a difference between the sense voltage $V_{SENSE}$ and the voltage of the digit line 210-a. A second output 460-a of the amplifier component 410-a may be coupled with the amplifier capacitor 415.

In some cases, during the signal development portion of the operation, amplifier component 410-a may be configured to operate in the amplifier mode by activating switching components 510-c and 510-d to configure transistors 505-a and 505-c to operate as a current mirror, and deactivating switching components 510-a, 510-b, 510-e, and 510-f. During the signal development portion, feedback from the second output 460-a to the second input 440-a of amplifier component 410-a may be disabled by deactivating switching component 260-f to uncouple second input 440-a from second output 460-a.

In the configuration depicted in FIG. 8, the amplifier component 410-a and the amplifier capacitor 415 may function together as a current integrator to integrate the charge received from the memory cell during the signal development portion of the read operation such that the voltage across the amplifier capacitor 415 changes based on (e.g., in proportion to) the amount of charge transferred between the memory cell and the amplifier capacitor (via the digit line). The voltage across the amplifier capacitor may therefore be used to determine the logic state of memory cell 105-a during a portion (e.g., a subsequent latch portion) of the read operation, as described below with respect to FIGS. 9-10.

The voltage of the digit line may remain at or near the offset-adjusted sense voltage $V_{SENSEOFF}$ as the charge is transferred between memory cell 105-b and the amplifier capacitor 415 and integrated. At the end of the signal development portion of the read operation, the amplifier capacitor 415 may store an amount of charge that is based on the amount of charge discharged from the memory cell, which is in turn based on the logic state of the memory cell. Thus, the voltage across amplifier capacitor 415 (e.g., the voltage at the first node 420) at the end of the signal development portion may be used to determine the logic state of the memory cell.

In some examples, during the signal development portion of the read operation, a DC current of the amplifier component may be bigger than the memory cell current. For example, the memory cell current for a switching memory cell (e.g., for a memory cell during the signal development portion) may be approximately 1 µA. In this case, a DC current for the amplifier component with an approximately 2 µA bias may be appropriate.

In some examples, the above-described techniques for reading a memory cell using a sense amplifier having a lower offset and higher speed, such as sense amplifier 225-a having amplifier component 410-a, may enable faster signal development relative to some cascode-based sense schemes or other types of sensing schemes, thereby increasing the speed of the read operation. Signal development may be faster because the voltage of digit line 210-a may be more stable than in a cascode-based implementation, and/or because the polarization of memory cell 105-a (e.g., the polarization described with respect to FIG. 3) may occur more quickly because the amplifier component is capable of maintaining a higher bias across the memory cell during the signal development portion of the read operation.

Figure 9:
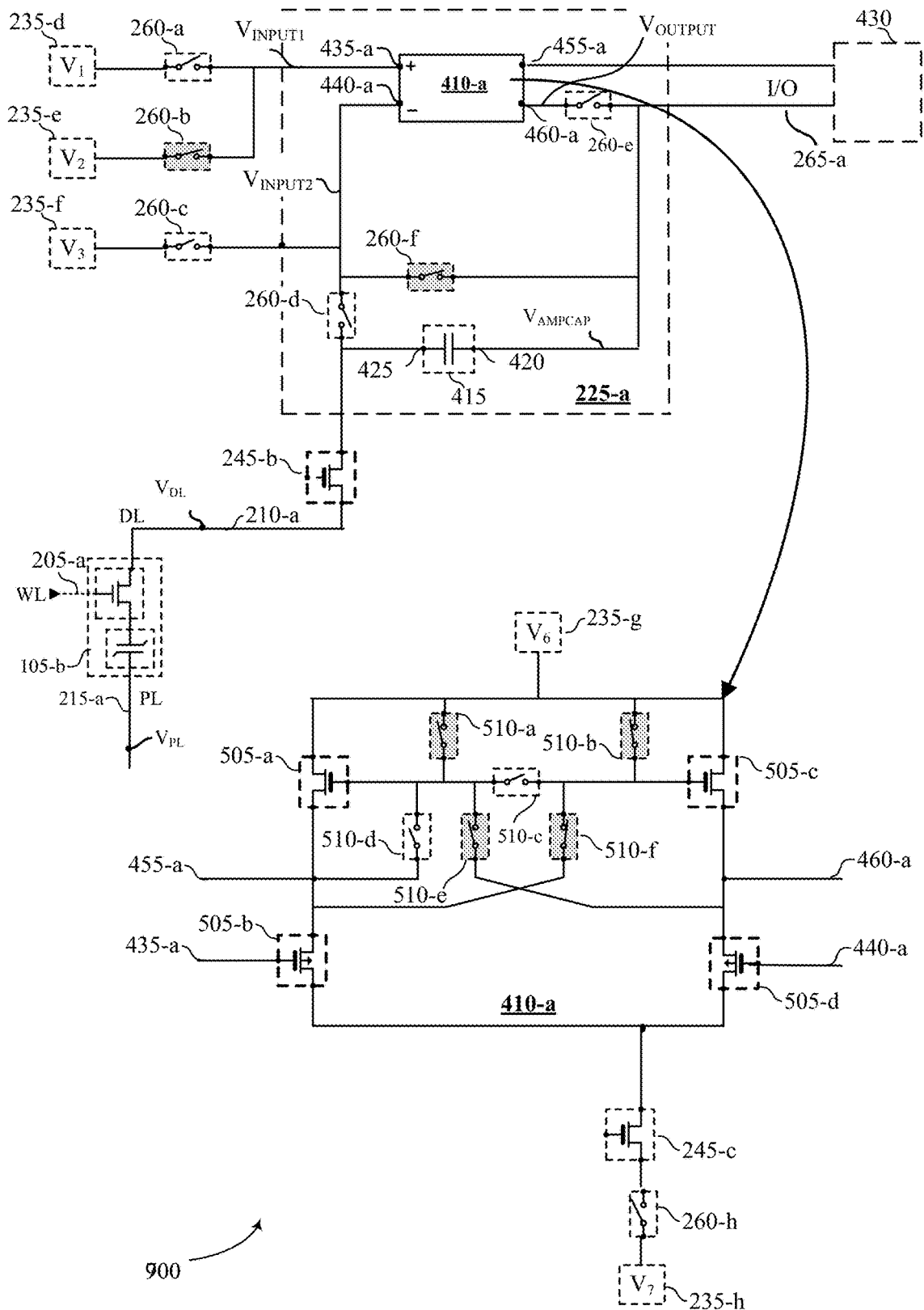
FIG. 9 illustrates an example of a circuit that supports sense amplifiers with lower offset and higher speed for sensing memory cells in accordance with examples of the present disclosure.

FIG. 9 illustrates an example of a circuit 900 that supports sense amplifiers with lower offsets and higher speeds for sensing memory cells in accordance with various examples of the present disclosure. Circuit 900 may be an example of a configuration of circuits 400 and 500 during a portion of a read operation.

In some cases, a read operation of a memory cell includes latching a state of a memory cell 105-a by performing a latch operation after the signal development portion of the read operation. A latch operation may include determining the state (e.g., by comparing the voltage of digit line 210-a and/or the voltage at the first node 420 of amplifier capacitor 415 with a reference voltage) and storing the state. In some examples, an amplifier component 410 may be configurable to operate in a latch mode such that activating the amplifier component while it is configured in the latch mode may cause the amplifier component to determine the state and store the state internally (e.g., for subsequent output to external components), or to output the state to a separate latch circuit that stores the state, or some combination.

Circuit 900 may be an example of circuits 400 and 500 as configured to prepare for a latch operation. To prepare for the latch operation, amplifier component 410-a may be configured to operate in a latch mode by activating switching components 510-e and 510-f to configure transistors 505-a, 505-c as a latch circuit (e.g., a half-latch circuit) by cross-coupling the transistors, and deactivating switching components 510-c and 510-d to deactivate the current mirror. Switching components 510-a and 510-b may be activated to couple amplifier component with voltage source 235-g (e.g., $V_{HSA}$).

Preparing for the latch operation may also include decoupling the second input 440-a of amplifier component 410-a from digit line 210-a by deactivating switching component 260-d and coupling second input 440-a with the first node 420 of amplifier capacitor 415 by activating switching component 260-f. The first input 435-a of amplifier component 410-a may be coupled with voltage source 235-e, which is associated with voltage V2 (e.g., a reference voltage, $V_{REF}$). Thus, in the configuration depicted in FIG. 9, amplifier component 410-a may be configured to determine, when it is activated in the latch mode, a logic state of memory cell 105-a by comparing a voltage of the first node 420 of amplifier capacitor 415 with a reference voltage $V_{REF}$.

In some examples, to prepare for the latch operation, amplifier component 410-a may be turned off or inactivated by deactivating switching component 260-h to decouple amplifier component 410-a from voltage supply 235-h (e.g., $V_{SS}$); that is, in some cases, amplifier component 410-a may not perform a latch operation until it is activated (e.g., fired) by coupling it with voltage supply 235-h while it is configured in the latch mode.

Figure 10:
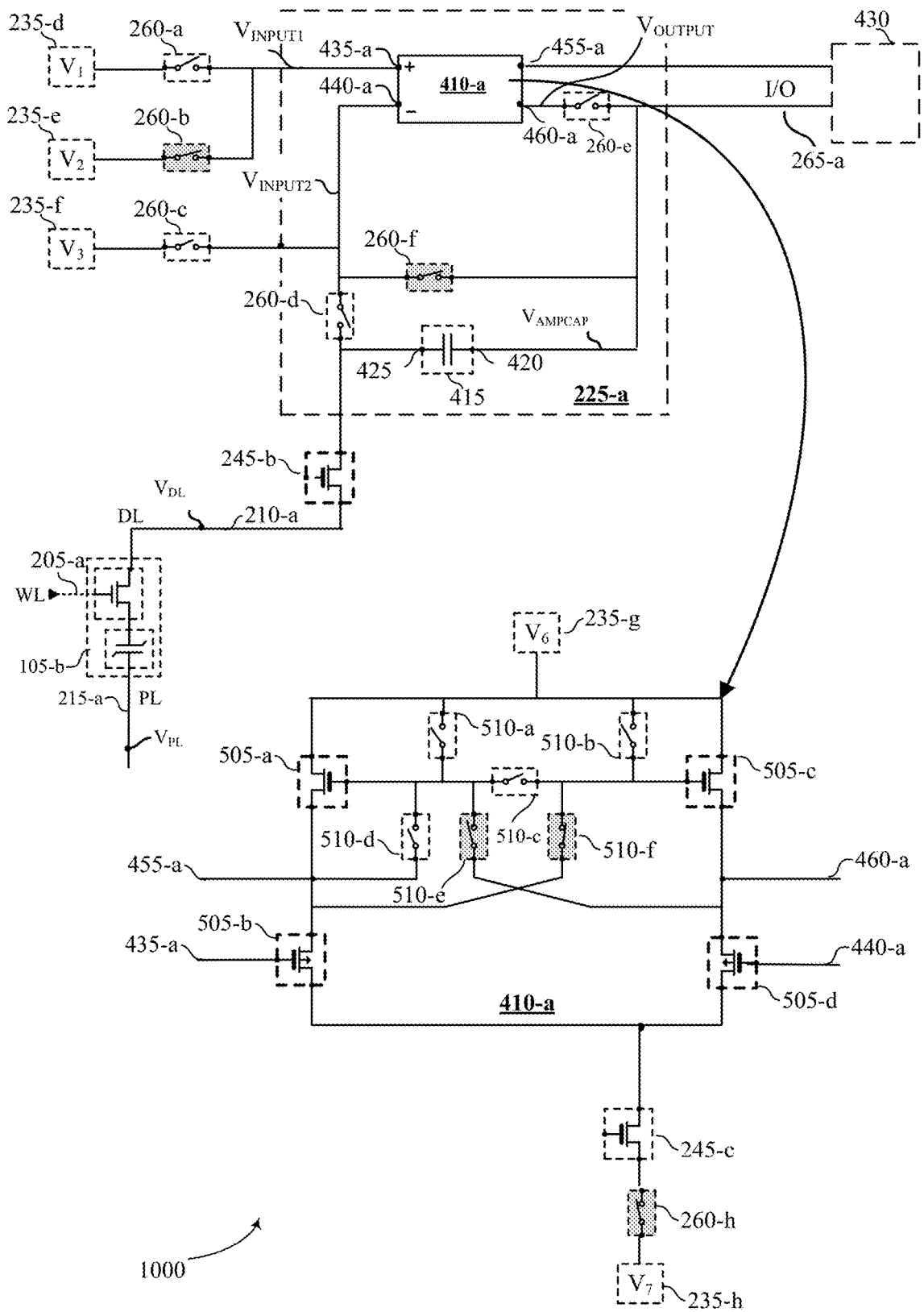
FIG. 10 illustrates an example of a circuit that supports sense amplifiers with lower offset and higher speed for sensing memory cells in accordance with examples of the present disclosure.

FIG. 10 illustrates an example of a circuit 1000 that supports sense amplifiers with lower offsets and higher speeds for sensing memory cells in accordance with various examples of the present disclosure. Circuit 1000 may be an example of a configuration of circuits 400 and 500 during a portion of a read operation.

After preparing for the latch operation as described above with respect to FIG. 9, amplifier component 410-a may be activated (e.g., fired) while it is configured in the latch mode to latch the state of memory cell 105-a. Amplifier 410-a may be activated by activating switching component 260-h to couple amplifier component 410-a with voltage source 235-h (e.g., $V_{SS}$) and deactivating switching components 510-a, 510-b to decouple the gates of transistors 505-a, 505-c from voltage source 235-g (e.g., $V_{HSA}$). In some cases, amplifier component 410-a may be activated in response to a trigger condition being met (e.g., based on a latch trip point).

In some cases, activating amplifier component 410-a while it is configured in the latch mode may cause amplifier component 410-a to determine a logic state of memory cell 105-a by comparing the voltage of the first node 420 of amplifier capacitor 415 with a reference voltage $V_{REF}$ received from voltage source 235-e (e.g., as described with respect to FIG. 2). In some cases, amplifier component 410-a may determine the state as either a first state or a second state (e.g., as a "0" or a "1").

In some cases, activating amplifier component 410-a while it is configured in the latch mode may cause amplifier component 410-a to store the determined state using transistors inside amplifier component 410-a (e.g., using transistors 505-a and 505-c as an internal latch circuit).

In some cases, amplifier component 410-a may be configurable, in latch mode, to operate as a half latch circuit that is capable of storing one state and providing the other state to a separate latch circuit 430. In some cases, activating amplifier component while it is configured in the latch mode may cause amplifier component 410-a to output the state to an external component (e.g., to a latch circuit 430 if a latch circuit is used to store the state) or to another component (e.g., if the amplifier component 410-a stores the state).

In some cases, an amplifier component 410 may use some of the same internal circuitry (e.g., transistors 505, switching components 510) when it is operating in amplifier mode (e.g., when it is used for pre-charging the digit line during the second pre-charging portion and/or amplifying a signal during the signal development portion) and when it is operating in a latch mode (e.g., when it is used for determining a state and/or storing the state). By re-using circuitry in amplifier component 410 for different operations, a trigger condition (e.g., the latch trip point) for activating the amplifier component 410-a in the latch mode may track the variation of the signal received from the memory cell during signal development better than alternatives, such as a cas-code-based implementation, because the offset introduced by amplifier component 410 into the signal received from the memory cell may be essentially cancelled out by including the same offset in the sense voltage (e.g., $V_{SENSEOFFSET}$) of the second pre-charging portion. In this case, amplifier component 410-a may be able to latch the state more quickly, thereby improving the performance of the memory device 100.

Figure 11:
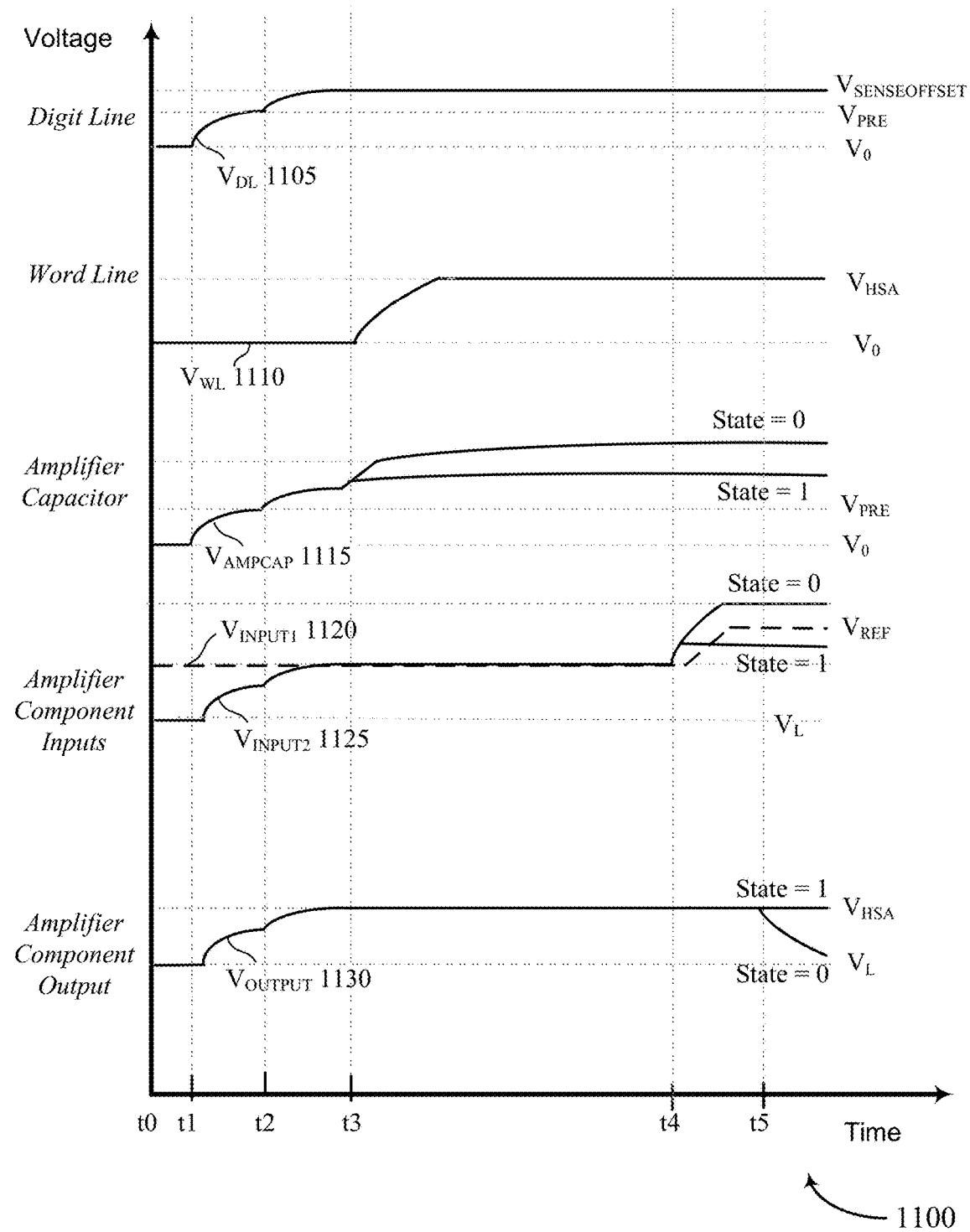
FIG. 11 shows a timing diagram illustrating operations of an example read operation that supports sense amplifiers with lower offset and higher speed for sensing memory cells in accordance with various examples of the present disclosure.

FIG. 11 shows a timing diagram 1100 illustrating operations of an example read operation that supports sense amplifiers with lower offset and higher speed for sensing memory cells in accordance with various examples of the present disclosure. The timing diagram 1100 is described with reference to components of the example circuits 400, 500, 600, 700, 800, 900, and 1000 of FIGS. 4-10, but may be illustrative of operations that may be performed with different circuit arrangements as well. Voltages and time ranges depicted in timing diagram 1100 may be approximate and are not to scale; they are intended to illustrate general circuit behavior rather than specific timing and voltage characteristics.

In the example of timing diagram 1100, memory cell 105-b may initially store a logic state (e.g., a logic 0 state, a logic 1 state) as described herein (e.g., with reference to FIG. 3). Certain signals illustrated in the timing diagram 1100 are therefore shown as alternatives associated with reading the different logic states, as indicated by the notation state=1 or state=0 (e.g., as associated with the respective logic states) where such signals are different.

In some examples, the read operation illustrated by timing diagram 1100 may begin at t0 with an initial state in which the word line is not asserted (e.g., logical signal WL is deactivated by setting it to $V_0$), and the digit line 210-a is isolated from voltage source 235-f (e.g., pre-charge voltage V3) by deactivating switching component 260-c, 260-d, and/or deactivating digit line selection component 245-b.

At time t1, a first portion (e.g., a first pre-charging portion) of the read operation may begin, as described with respect to FIG. 6. During the first portion, amplifier component 410-a may be inactive (e.g., switching component 260-h and/or voltage supply selection component transistor 245-c may be deactivated). Amplifier component 410-a may be configured with some or all of internal switching components 510 deactivated.

The first portion may include activating switching components 260-c and 260-d and voltage supply selection component 245-c to couple digit line 210-a with voltage source 235-f, which may be associated with voltage V3 (e.g., a pre-charge voltage, $V_{PRE}$). Activating switching components 260-c and 260-d and selection component 245-b may also couple digit line 210-a and voltage source 235-f with the second input 440-a of amplifier component 410-a and the second node 425 of amplifier capacitor 415.

During the first pre-charging portion, the voltage of the digit line, $V_{DL}$ 1105, may begin to rise to a first voltage (e.g., towards $V_{PRE}$). The voltage at the second node of amplifier capacitor 415 $V_{AMPCAP}$ 1115, the voltage at the second input 440 of amplifier component 410-a $V_{INPUT2}$ 1125, and the voltage at the second output 460 of amplifier component 410-a $V_{OUTPUT}$ 1130 may also increase (e.g., begin to rise).

At time t2, a second portion (e.g., a second pre-charging portion) of the read operation may begin, as described with respect to FIG. 7.

The second portion may include deactivating switching component 260-c to uncouple digit line 210-a from voltage source 235-f, and activating switching component 260-a to couple voltage source 235-d with the first input 435-a of amplifier component 410-*a*. Voltage source 235-*d* may be associated with voltage V1 (e.g., a sense voltage, $V_{SENSE}$). The second portion may also include activating switching components 260-*e* and 260-*f* to couple the second output 460-*a* of amplifier component 410-*a* with the second input 440-*a* of amplifier component 410-*a* (e.g., to enable a feedback line).

Activating switching components 260-*d* and 260-*f* may also, in some examples, couple digit line 210-*a* with the second input 440-*a* of amplifier component 410-*a*.

During the second portion, amplifier component 410-*a* may be configured to operate in an amplifier mode. In some cases, this may be based on activating switching components 510-*c* and 510-*d* and deactivating switching components 510-*a*, 510-*b*, 510-*e*, and 510-*f*. In this configuration, the gate of transistor 505-*a* may be coupled with the gate of transistor 505-*c*, and transistors 505-*a* and 505-*c* may be configured to operate as a current mirror.

When amplifier component 410-*a* is configured to operate in the amplifier mode and has its inputs and outputs coupled as described above, amplifier component 410-*a* may operate as a voltage buffer that adjusts the voltage of digit line 210-*a* $V_{DL}$ 1105 from a first voltage (e.g., the voltage at the end of the first portion, $\sim V_{PRE}$) to a second voltage (e.g., an offset-adjusted sense voltage, $V_{SENSEOFF}$). The offset-adjusted sense voltage may, in some cases, be the sense voltage $V_{SENSE}$ adjusted by the voltage offset of amplifier component 410-*a*.

Similarly, the voltage at the first node 425 of amplifier capacitor 415 ($V_{AMPCAP}$ 1115), the voltage at the second input 440 of amplifier component 410-*a* ($V_{INPUT2}$ 1125), and/or the voltage at the second output 460-*a* ($V_{OUTPUT}$ 1130) of amplifier component 410-*a* may also be adjusted from a first voltage (e.g., the voltage to which they were raised during a first portion of the read operation, such as a first pre-charging portion) to a second voltage.

At time t3, a third portion (e.g., a signal development portion) of the read operation may begin, as described with respect to FIG. 8.

The third portion may include asserting a word line signal to couple memory cell 105-*a* with digit line 210-*a*. In some cases, the word line signal may be asserted by raising the word line voltage $V_{WL}$ 1110 to $V_{HSA}$, as depicted in FIG. 11. Memory cell 105-*a* may then begin to discharge an amount of electric charge onto digit line 210-*a*.

The third portion may include deactivating switching component 260-*f* to uncouple the second output 460-*a* of amplifier component 410-*a* from the second input 440-*a* of amplifier component, which may deactivate the feedback line established during the second portion.

During the third portion, amplifier component 410-*a* may be configured in the amplifier mode, with switching components 510-*d* and 510-*c* activated and switching components 510-*a*, 510-*b*, 510-*e*, and 510-*f* deactivated, such that transistors 505-*a* and 505-*c* are configured to function as a current mirror. During the signal development portion, amplifier component 410-*a* may amplify a difference between $V_{INPUT1}$ 1120 (e.g., V1, which may be a sense voltage $V_{SENSE}$) and the voltage of $V_{INPUT2}$ 1125 (e.g., the voltage of digit line 210-*a*, $V_{DL}$).

During the third portion, the second output 460-*a* of amplifier component 410-*a* may be coupled with the first node 420 of amplifier capacitor 415 by activating switching component 260-*e*, and the second node 425 of amplifier capacitor 415 may be coupled with digit line 210-*a*. In this configuration, amplifier component 410-*a* and amplifier capacitor 415 may function as a current integrator. As a result, during the signal development portion, the amount of electric charge that is discharged by memory cell 105-*a* onto digit line 210-*a* may be integrated by amplifier component 410-*a* and amplifier capacitor 415, while the voltage $V_{DL}$ 1105 of digit line 210-*a* is set at or near (e.g., remains at or near) the second voltage (e.g., the offset-adjusted sense voltage $V_{SENSEOFF}$).

As depicted in FIG. 11, during the signal development portion of the read operation, the voltage $V_{AMPCAP}$ 1115 at the first node 420 of the amplifier capacitor 415 changes as the electric charge is integrated. The amount of change in the voltage $V_{AMPCAP}$ 1115 depends on whether the memory cell 105-*a* was storing a state of "0" or "1."

At time t4, a fourth portion (e.g., a prepare to latch portion) of the read operation may begin, as described with respect to FIG. 9. During the fourth portion, the amplifier component may be prepared for the latch operation by activating switching components 510-*e* and 510-*f* to configure amplifier component 410-*a* to operate in the latch mode to cross-couple transistors 505-*a* and 505-*c*.

During the fourth portion, the digit line 210-*a* may be uncoupled from the second input 440-*a* of amplifier component 415 by deactivating switching component 260-*d*. The amplifier component 415 may be turned off or deactivated during the fourth portion by deactivating switching component 260-*h* to decouple the amplifier component 410-*a* from voltage source 235-*h* (e.g., $V_{SS}$) and activating switching components 510-*a* and 510-*b* to couple amplifier component with voltage source V6 (e.g., $V_{HSA}$). The first input 435-*a* of amplifier component 410-*a* may be coupled with voltage source 235-*e*, which may be associated with voltage V2 (e.g., a reference voltage $V_{REF}$); thus, at t4, the voltage $V_{INPUT1}$ 1120 at the first input 435-*b* may rise towards $V_{REF}$.

The second input 440-*a* may be coupled with the first node 420 of amplifier capacitor 420 by activating switching component 260-*f*, and therefore voltage $V_{INPUT2}$ at second input 440-*a* may rise towards $V_{AMPCAP}$. As noted above, the voltage of $V_{AMPCAP}$ may depend on whether the memory cell 105-*a* was storing a state of "0" or "1," thus two states are represented.

At time t5, a fifth portion (e.g., a latch portion) of the read operation may begin, when the amplifier component is activated (fired) while it is configured in the latch mode. The amplifier component 410-*a* may be activated by activating switching component 260-*h* to couple amplifier component with voltage source 235-*h* and deactivating switching components 510-*a* and 510-*b* to decouple amplifier component from voltage source 235-*g*.

When amplifier component 410-*a* is activated while configured in the latch mode, amplifier component may determine the state of memory cell 105-*a* by comparing the voltage of amplifier capacitor $V_{AMPCAP}$ (as received at the second input 440-*a*, via $V_{INPUT2}$ 1125) with a reference voltage $V_{REF}$ (as received at the first input 435-*a*, via $V_{INPUT1}$ 1120). For example, when the memory cell 105-*b* stores a logic state 1, $V_{AMPCAP}$ may be lower than $V_{REF}$, while when the memory cell 105-*b* stores a logic state 0, $V_{AMPCAP}$ may be higher than $V_{REF}$. Based on the comparison, the voltage at the second output 460-*a* of amplifier component 415 ($V_{OUTPUT}$ 1130) may reflect a voltage associated with a logic state of 1 or 0.

Amplifier component may, in some examples, store the state internally (e.g., using transistors 505-*a* and 505-*c*) and output the stored state to an external component, or amplifier component may, in some examples, output the state (e.g., to a separate latch circuit) without storing the state internally.

Although illustrated in FIG. 11 as separate operations occurring at different times, certain operations may occur simultaneously, concurrently, or in a different order. In some examples, various operations may be advantageously initiated simultaneously or concurrently to reduce the amount of time for sensing a logic state of the memory cell 105-b.

The order of operations shown in timing diagram 1100 is for illustration only, and various other orders and combinations of steps may be performed to support sense amplifiers with lower offset and higher speed for sensing memory cells in accordance with the present disclosure. Further, the timing of the operations of the timing diagram 1100 is also for illustration purposes only, and is not meant to indicate a particular relative duration between one operation and another. Various operations may occur over a duration that is relatively shorter or relatively longer than illustrated in various examples of sense amplifiers with lower offset and higher speed for sensing memory cells in accordance with the present disclosure.

The transitions of the logical signals of the timing diagram 1100 are illustrative of transitions from one state to another, and generally reflect transitions between a disabled or deactivated state (e.g., state "0") and an enabled or activated state (e.g., state "1") as associated with a particular operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based at least in part on characteristics of the associated logical signal, including the voltage level of the logical signal or the transition characteristics of the logical signal itself. Thus, the transitions shown in timing diagram 1100 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

Figure 12:
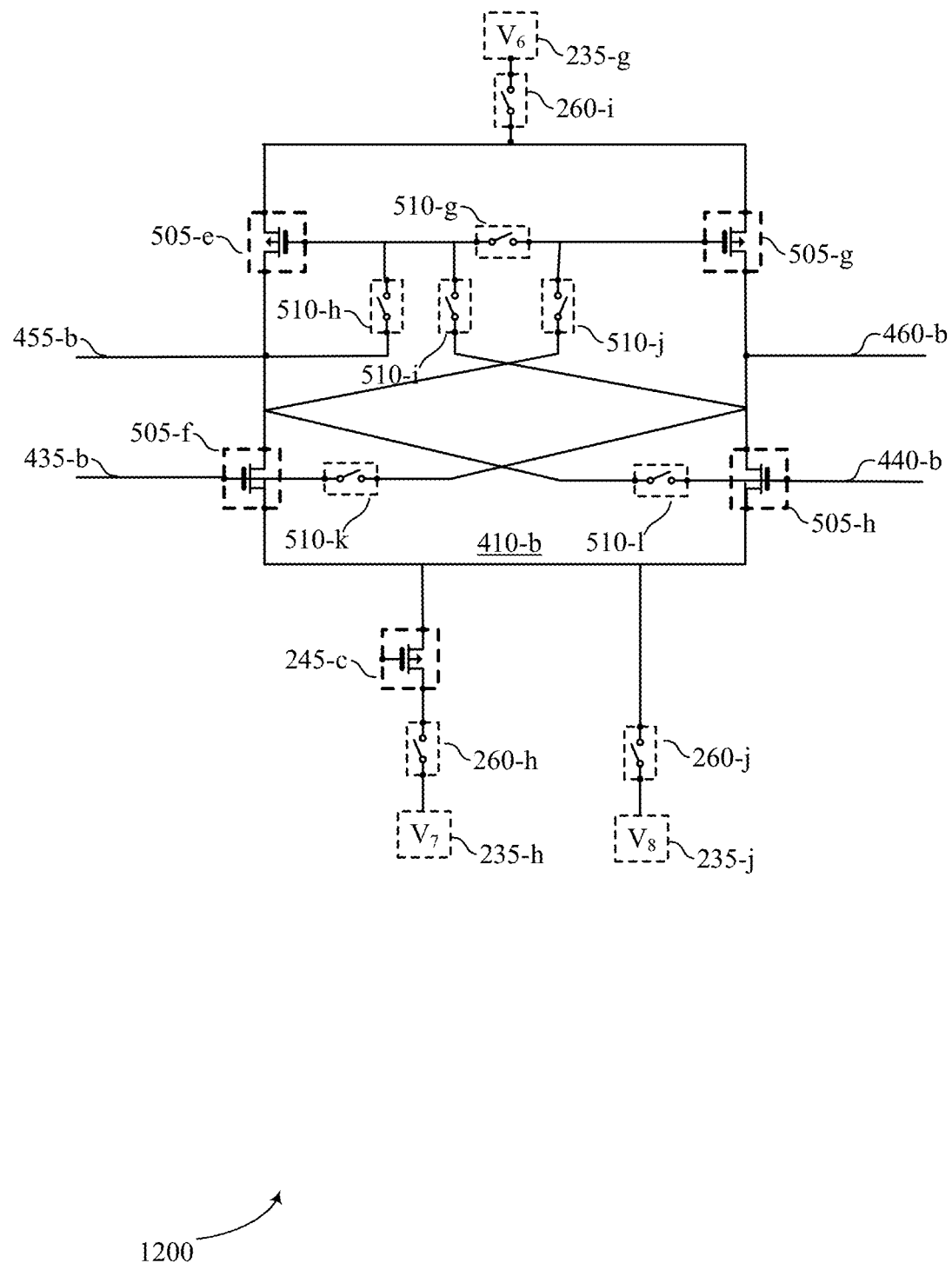
FIG. 12 illustrates an example of a circuit that supports sense amplifiers with lower offset and higher speed for sensing memory cells in accordance with examples of the present disclosure.
Figure 13:
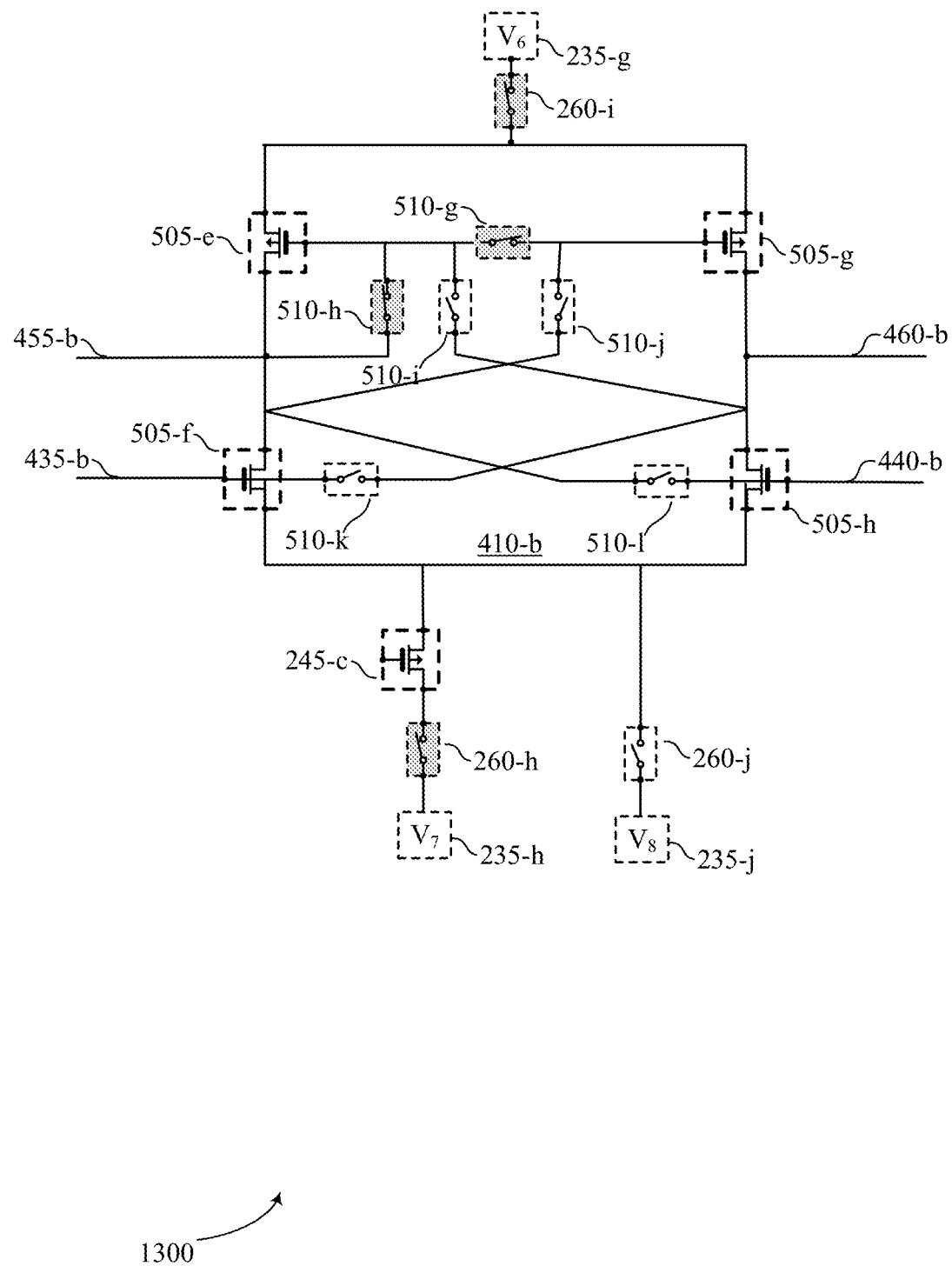
FIG. 13 illustrates an example of a circuit that supports sense amplifiers with lower offset and higher speed for sensing memory cells in accordance with examples of the present disclosure.
Figure 14:
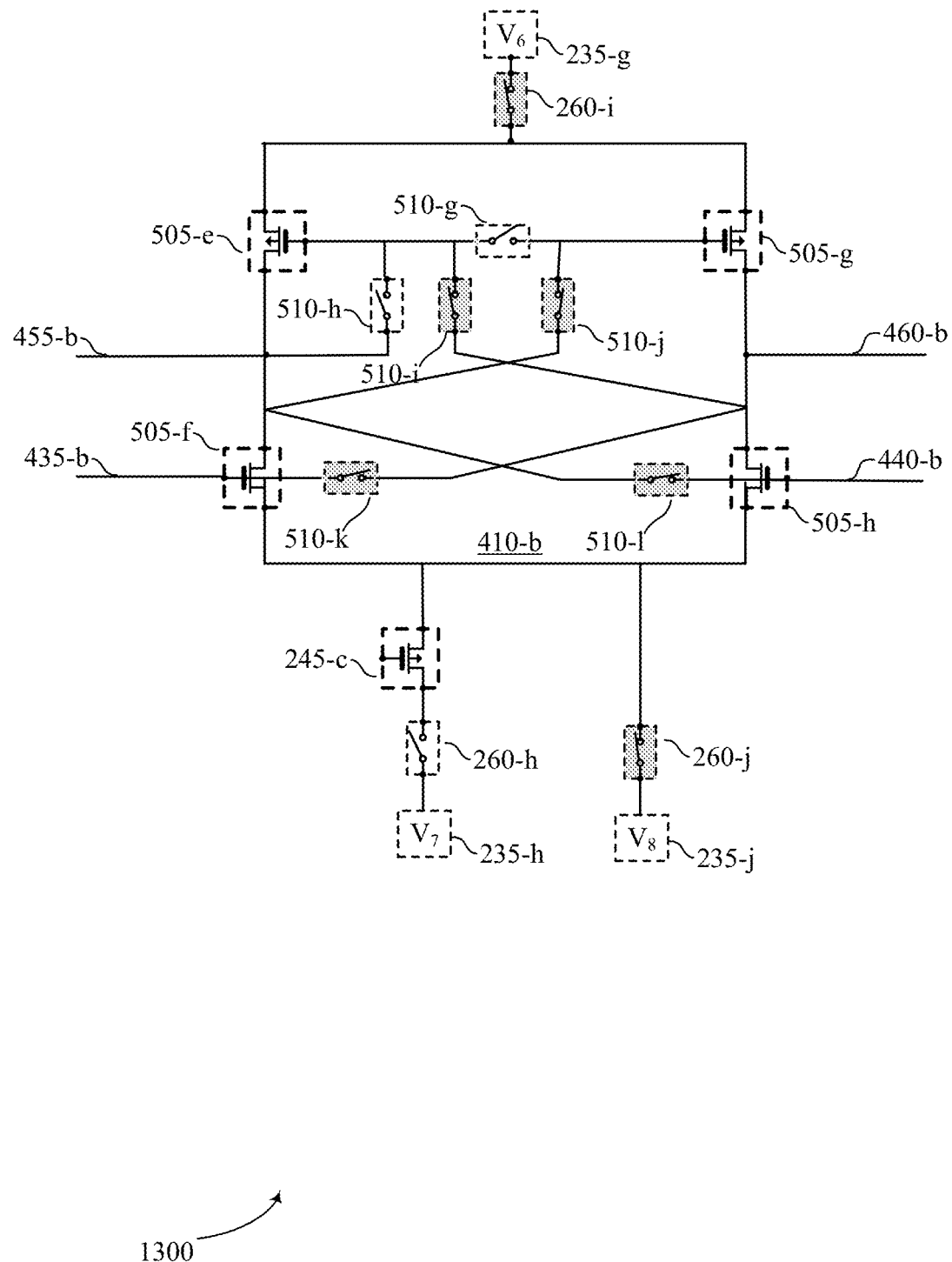
FIG. 14 illustrates an example of a circuit that supports sense amplifiers with lower offset and higher speed for sensing memory cells in accordance with examples of the present disclosure.

Although FIGS. 5-11 have been discussed with respect to an amplifier component that may be configurable to operate, while in a latch mode, as a half latch, alternative examples of amplifier component 410 may be configurable to operate as a full latch, as discussed with respect to FIGS. 12-14.

FIG. 12 illustrates an example of a circuit 1200 that supports sense amplifiers with lower offsets and higher speeds for sensing memory cells in accordance with various examples of the present disclosure. Circuit 1200 provides additional detail with respect to the circuitry of an amplifier component 410-b, which may be an example of amplifier component 410 described with respect to FIG. 4 and which may be substituted for amplifier component 410-a as described with respect to FIGS. 5-11.

Circuit 1200 may depict an example of an amplifier component that may be configurable to operate, in a latch mode, as a full latch. Amplifier component 410-b may, in some cases, operate in a manner similar to that described with respect to amplifier 410-a in FIGS. 5-11 during a read operation of a memory cell. However, amplifier component 410-b includes additional circuitry with respect to amplifier component 410-a to enable amplifier component 410-b to be configurable to operate as a full latch. Accordingly, a separate latch circuit (e.g., latch circuit 430) may not be used in memory devices that include amplifier component 410-b.

Relative to amplifier component 410-a, amplifier component 410-b includes additional switching components 510-k and 510-l and associated additional conductive lines to enable cross-coupling of transistors 505-b, 505-d. Amplifier component 410-b may be coupled with voltage sources 235-h, 235-g, and 235-j via switching component 260-h and voltage supply selection component 245-c, switching component 260-i, and switching component 260-j, respectively. In some examples, voltage source 235-j is associated with voltage V8, which may be a supply voltage. In some examples, voltage sources 235-h and voltage source 235-j are each associated with the same supply voltage (e.g., $V_{SS}$). Amplifier component 410-b may be activated by activating switching component 260-h and voltage supply selection component 245-c, or by activating switching component 260-j.

In some examples, voltage supply 235-j and switching component 260-j may be optional. In some examples, the addition of voltage source 235-j may provide additional flexibility with respect to using the same control signal to couple a voltage supply (e.g., $V_{ss}$) with the amplifier component 410-b and to configure the amplifier component 410-b in the amplifier mode or the latch mode. For example, a memory device may use the same control signal to activate switching components 260-j and switching components 510i, 510-j, 510-k, and 510-l to configure and fire amplifier component 410-b in a latch mode.

Amplifier component 410-b includes a first input 435-b, a second input 440-b, a first output 455-b, and a second output 460-b. In some examples, first input 435-b may be referred to as a positive input, and second input 440-b may be referred to as a negative input or feedback input. In some examples, first output 455-b and second output 460-b may be inverses of each other; that is, a voltage or current at first output 455-b may be the opposite of a voltage or current at second output 460-b.

Amplifier component 410-b includes various internal transistors 505 and switching components 510. In some examples, transistors 505 may be MOS transistors. In some cases, transistors 505-e and 505-g may be PMOS transistors. In some cases, transistors 505-f and 505-h may be either PMOS transistors or NMOS transistors. Other examples of an amplifier component 410-b may use other types of transistors.

In some cases, switching components 510-i, 510-j, 510-k, and 510-l may be CMOS switching components (e.g., including both PMOS and NMOS transistors) to enable these switching components to pass 0 and $V_{HSA}$ voltages. In some cases, switching components 510-d and 510-d can be PMOS, NMOS, or CMOS switching components.

As discussed with respect to amplifier component 410-a, switching components 510 in amplifier component 410-b may be used to couple or uncouple various nodes of transistors 505 with each other and/or with inputs or outputs of amplifier component 410-b and thereby configure amplifier component 410-b to operate in an amplifier mode or a latch mode, as discussed with respect to FIGS. 13-14.

FIG. 13 illustrates an example of a circuit 1300 that supports sense amplifiers with lower offsets and higher speeds for sensing memory cells in accordance with various examples of the present disclosure. Circuit 1300 depicts amplifier component 410-*b* as configured to operate in an amplifier mode, such as during a second pre-charging portion of a read operation or during a signal development portion of a read operation as discussed with respect to FIGS. 5 and 8.

In the example depicted in FIG. 13, amplifier component 410-*b* may be configured to operate in an amplifier mode by activating switching component 510-*h* and 510-*g* deactivating switching components 510-*i*, 510-*j*, 510-*k*, and 510-*l*. In this configuration, transistors 505-*e* and 505-*g* are configured to operate as a current mirror. Amplifier component 410-*b* may be turned on or activated by activating switching components 260-*h* and 260-*i* and voltage supply selection component 245-*c* to couple amplifier component 410-*b* with voltage sources 235-*h* and 235-*g*.

FIG. 14 illustrates an example of a circuit 1400 that supports sense amplifiers with lower offsets and higher speeds for sensing memory cells in accordance with various examples of the present disclosure. Circuit 1400 depicts amplifier component 410-*b* as configured to operate in a latch mode, such during a latch portion of a read operation as discussed with respect to FIG. 10.

In the example depicted in FIG. 14, amplifier component 410-*b* may be configured to operate in the latch mode by activating switching components 510-*i*, 510-*j*, 510-*k*, and 510-*l* and deactivating switching components 510-*g* and 510-*h*. In this configuration, transistors 505-*a*, 505-*b*, 505-*c*, and 505-*c* are cross-coupled and configured to operate as a full latch. Amplifier component 410-*b* may be activated by activating switching component 260-*j* to couple amplifier component with voltage source 235-*j* (e.g., $V_{SS}$). In some examples, the same control signal may be used to activate switching components 260-*j*, 510-*i*, 510-*j*, 510-*k*, and 510-*l*.

Figure 15:
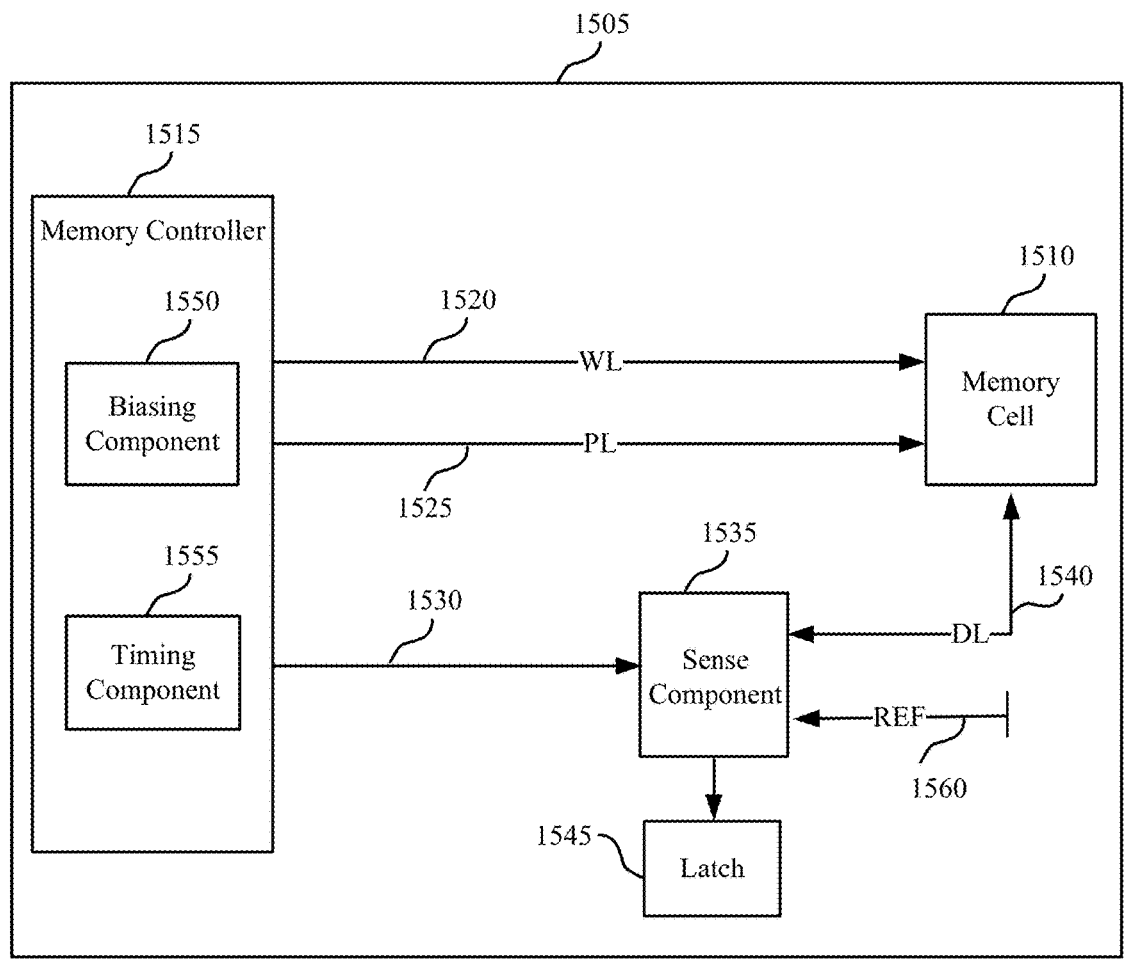
FIG. 15 shows a block diagram of a memory device that may support sense amplifiers with lower offset and higher speed for sensing memory cells in accordance with various examples of the present disclosure.

FIG. 15 shows a block diagram 1500 of a memory device 1505 that may support sense amplifiers with lower offset and higher speed for sensing memory cells in accordance with various examples of the present disclosure. The memory device 1505 may be referred to as an electronic memory apparatus, and may be an example of a component of a memory device 100 as described with reference to FIG. 1.

The memory device 1505 may include one or more memory cells 1510, which may be an example of memory cells 105 described with reference to FIGS. 1 through 14. The memory device 1505 may also include a memory controller 1515, a word line 1520, a plate line 1525, a sense component 1535, and a digit line 1540. These components may be in electronic communication with each other and may perform one or more of the functions described herein in accordance with aspects of the disclosure. In some cases, the memory controller 1515 may include a biasing component 1550 and a timing component 1455.

The memory controller 1515 may be in electronic communication with the word line 1520, the plate line 1525, the digit line 1540, and the sense component 1535, which may be examples of a word line 205, a plate line 215, a digit line 210, a reference line 255, and a sense component 130 described with reference to FIGS. 1 through 14. In some examples, the memory device 1505 may also include a latch 1545, which may be an example of a latch circuit 430 or an I/O component 150 as described herein. The components of the memory device 1505 may be in electronic communication with each other and may perform examples of the functions described with reference to FIGS. 1 through 14. In some cases, the sense component 1535 or latch 1545 may be components of memory controller 1515.

In some examples, the digit line 1540 may be in electronic communication with the sense component 1535 and a ferroelectric capacitor of a memory cell 1510. A memory cell 1510 may be writable with a logic state (e.g., a first or second logic state). The word line 1520 may be in electronic communication with the memory controller 1515 and a cell selector of a memory cell 1510. The plate line 1525 may be in electronic communication with the memory controller 1515 and a plate of the ferroelectric capacitor of a memory cell 1510. The sense component 1535 may be in electronic communication with the memory controller 1515, the digit line 1540, and the latch 1545. In some examples, a common access line may provide the functions of a signal line and a reference line. The sense control line 1530 may be in electronic communication with the sense component 1535 and the memory controller 1515. These components may also be in electronic communication with other components, inside, or outside, or both of the memory device 1505, in addition to components not listed above, via other components, connections, or busses.

The memory controller 1515 may be an example of a memory controller 150 as described herein, and may be configured to activate the word line 1520, the plate line 1525, and/or the digit line 1540 by applying voltages to various nodes. For example, the biasing component 1550 may be configured to apply a voltage to operate the memory cell 1510 to read or write the memory cell 1510 as described above. In some cases, the memory controller 1515 may include a row decoder, column decoder, or both, as described with reference to FIG. 1, which may enable the memory controller 1515 to access one or more memory cells 105. The biasing component 1550 may also provide voltage potentials to the memory cell 1510 to generate a reference signal for the sense component 1535. Additionally or alternatively, the biasing component 1550 may provide voltage potentials for the operation of the sense component 1535.

In some cases, the memory controller 1515 may perform one or more of its operations using the timing component 1555. For example, the timing component 1555 may control the timing of the various word line selections or plate biasing, including timing for switching and voltage application to perform the memory functions, such as reading and writing, discussed herein (e.g., in accordance with operations described with reference to timing diagram 1100 of FIG. 11). In some cases, the timing component 1555 may control the operations of the biasing component 1550.

The sense component 1535 may compare a sense signal from the memory cell 1510 (e.g., via digit line 1540) with a reference signal (e.g., via reference line 1560). The reference signal may be received from a voltage source, for example, or from memory cell 1510. The sense component 1535 may include one or more amplifier components in electronic communication with the latch and the ferroelectric memory cell. Upon determining the logic state, the sense component 1535 may then store the state in an amplifier component in the sense component (e.g., amplifier component 410 as described with respect to FIGS. 4-14) or may store the state in the latch 1545, where it may be used in accordance with the operations of an electronic device that may include the memory device 1505.

The memory controller 1515, or its sub-components, may be implemented in hardware, code (e.g., software, firmware) executed by a processor, or any combination thereof. If implemented in code executed by a processor, the functions of the memory controller 1515, or its sub-components, may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 1515, or its sub-components, may be physically located at various positions, including being distributed such that portions of functions are implemented at different physical locations by one or more physical devices. In some examples, the memory controller 1515, or its sub-components, may be a separate and distinct component in accordance with various examples of the present disclosure. In other examples, the memory controller 1515, or its sub-components, may be combined with one or more other hardware components, including but not limited to an I/O component, a transceiver, a network server, another computing device, one or more other components described in the present disclosure, or a combination thereof in accordance with various examples of the present disclosure. The memory controller 1515 may be an example of the memory controller 1715 described with reference to FIG. 17.

In some examples, the memory controller 1515, including any subcomponents thereof, may support coupling, during a signal development portion of a read operation of a memory cell, a ferroelectric capacitor of the memory cell with a digit line associated with the memory cell to adjust an amount of electric charge on the digit line; coupling, during the signal development portion, a first input of an amplifier component with the digit line to amplify a voltage of the digit line; decoupling, after the signal development portion of the read operation, the first input of the amplifier component from the digit line; configuring the amplifier component to operate in a latch mode based at least in part on activating or deactivating a first switching component in the amplifier; and outputting, on a first output of the amplifier, a state of the memory cell while the amplifier component operates in the latch mode.

In some examples, the memory controller 1515, including any subcomponents thereof, may support activating or deactivating switching components in memory device 1505 (e.g., in sense component, sense amplifier, and/or amplifier component) by providing control signals to such switching components. In this manner, memory controller 1515 may support configuring an amplifier component in an amplifier mode or a latch mode by providing control signals to switching components within amplifier component to activate or deactivate the switching components.

Figure 16:
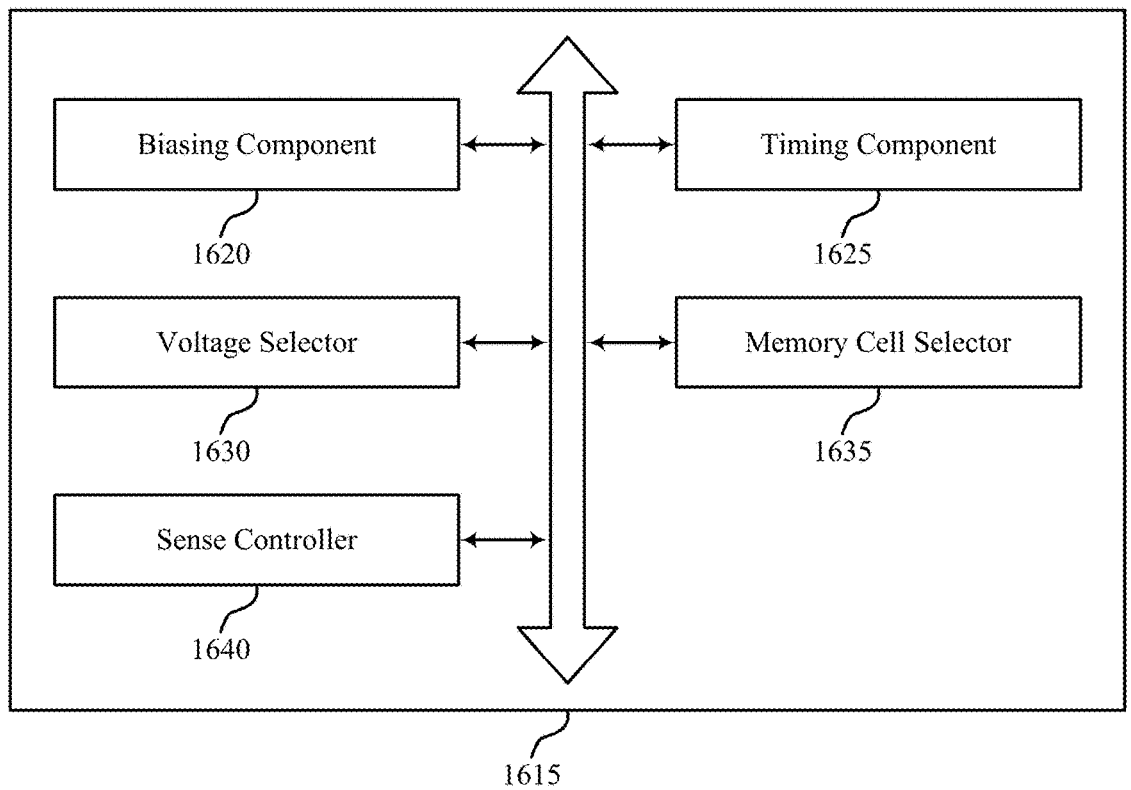
FIG. 16 shows a block diagram of a memory controller that may support sense amplifiers with lower offset and higher speed for sensing memory cells in accordance with various examples of the present disclosure.

FIG. 16 shows a block diagram 1600 of a memory controller 1615 that may support sense amplifiers with lower offset and higher speed for sensing memory cells in accordance with various examples of the present disclosure. The memory controller 1615 may be an example of a memory controller 150 described with reference to FIG. 1 or a memory controller 1515 described with reference to FIG. 15. The memory controller 1615 may include a biasing component 1620 and a timing component 1625, which may be examples of biasing component 1550 and timing component 1555 described with reference to FIG. 15. The memory controller 1615 may also include a voltage selector 1630, a memory cell selector 1635, and a sense controller 1640. Each of these modules may communicate, directly or indirectly, with one another (e.g., via one or more buses).

The voltage selector 1630 may initiate the selection of voltage sources to support various access operations of a memory device. For example, the voltage selector 1630 may generate logical signals used to activate or deactivate various switching components, such as the switching components 260 or the selection components 245 described with reference to FIGS. 4-13. For example, the voltage selector 1630 may generate one or more of the logical signals for selecting (e.g., enabling, disabling) the voltage sources 235 of the timing diagram 1100 described with reference to FIG. 11.

The memory cell selector 1635 may select a memory cell for sensing operations. For example, the memory cell selector 1635 may generate logical signals used to activate or deactivate a cell selector, such as selection component 245 described with reference to FIG. 2. For example, the memory cell selector 1635 may generate the word line signal of timing diagram 1100 described with reference to FIG. 11.

The sense controller 1640 may control various operations of a sense component, such as the sense components 130 described with reference to FIGS. 1 through 14. For example, the sense controller 1640 may generate logical signals used to activate or deactivate a switching component, such as the switching components 260 described with reference to FIGS. 4-14. In some examples, the sense controller 1640 may generate logical signals used to couple or decouple a sense component with a sensing voltage source, which may include activating or deactivating switching components such as switching components 260-*h*, 260-*i*, 260-*j*, or selection components 245 as described with reference to FIGS. 4-14.

In some examples, the sense controller 1640 may compare a voltage of a first input of an amplifier component with a voltage of a second input of the amplifier component, where the voltages are based on (e.g., result from) accessing the memory cell with one or more access operations of a read operation. The sense controller 1640 may determine a logic value associated with the memory cell based on comparing the resultant voltages. In some examples, the sense controller 1640 may provide signals to another component to determine the logic value associated with the memory cell.

Figure 17:
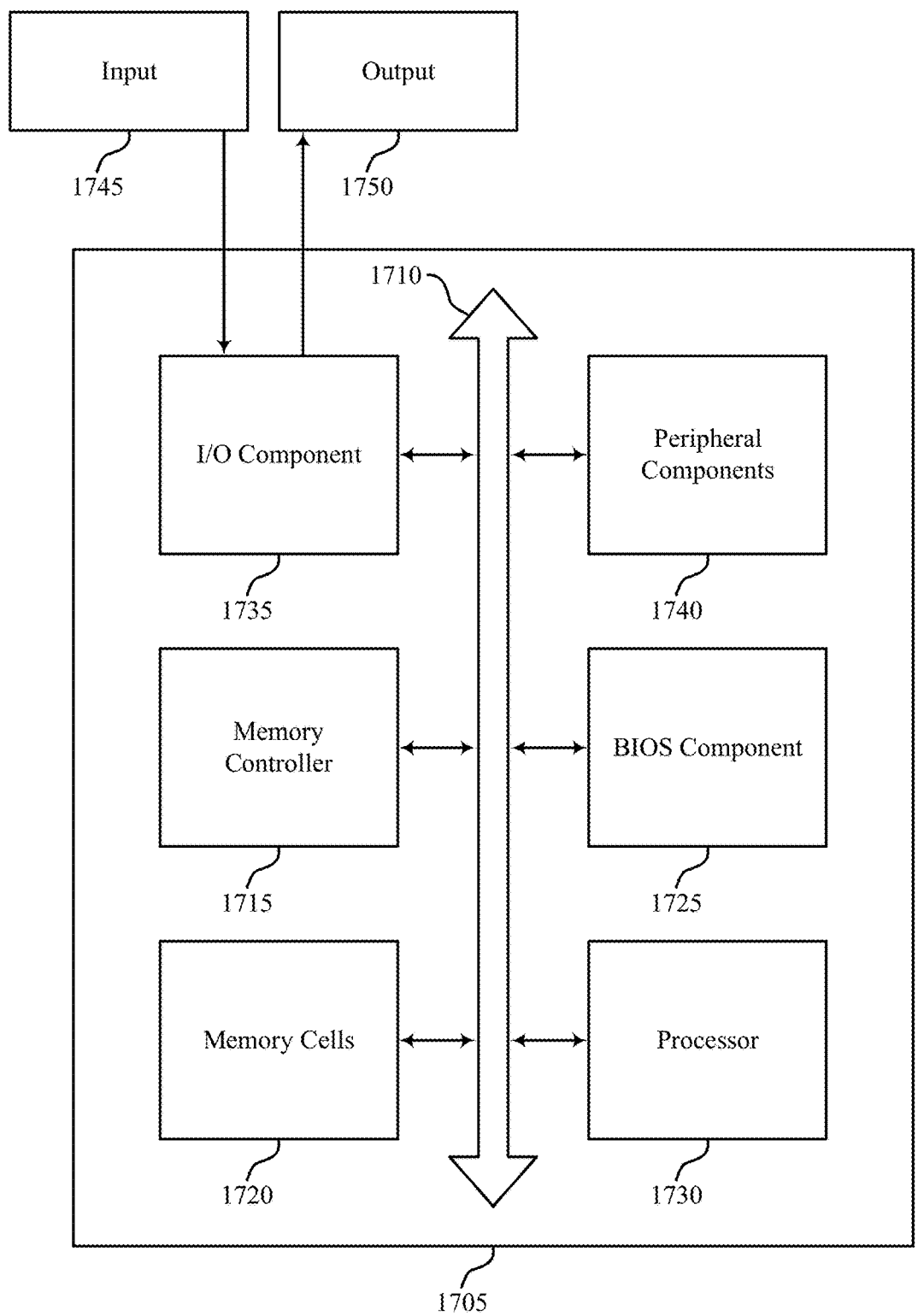
FIG. 17 shows a diagram of a system including a device that may support sense amplifiers with lower offset and higher speed for sensing memory cells in accordance with various examples of the present disclosure.

FIG. 17 shows a diagram of a system 1700 including a device 1705 that may support sense amplifiers with lower offset and higher speed for sensing memory cells in accordance with various examples of the present disclosure. The device 1705 may be an example of or include the components of memory device 100 as described above, for example, with reference to FIG. 1. The device 1705 may include components for bi-directional communications including components for transmitting and receiving communications, including a memory controller 1715, memory cells 1720, a basic input/output system (BIOS) component 1725, a processor 1730, an I/O component 1735, and peripheral components 1740. These components may be in electronic communication via one or more busses (e.g., bus 1710).

The memory controller 1715 may operate one or more memory cells as described herein. Specifically, the memory controller 1715 may be configured to support the described sense amplifiers for sensing a logic state of a memory cell. In some cases, the memory controller 1715 may include a row decoder, column decoder, or both, as described with reference to FIG. 1 (not shown).

The memory cells 1720 may be an example of memory cells 105 or 1410 described with reference to FIGS. 1 through 14, and may store information (e.g., in the form of a logic state) as described herein.

The BIOS component 1725 be a software component that includes BIOS operated as firmware, which may initialize and run various hardware components. The BIOS component 1725 may also manage data flow between a processor and various other components, such as peripheral components, I/O control components, and others. The BIOS component 1725 may include a program or software stored in read only memory (ROM), flash memory, or any other non-volatile memory.

The processor 1730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1730 may be configured to operate a memory array using a memory controller. In other cases, a memory controller may be integrated into the processor 1730. The processor 1730 may be configured to execute computer-readable instructions stored in a memory to perform various functions (e.g., functions or tasks supporting self-referencing sensing schemes for accessing memory cells).

The I/O component 1735 may manage input and output signals for the device 1705. The I/O component 1735 may also manage peripherals not integrated into the device 1705. In some cases, the I/O component 1735 may represent a physical connection or port to an external peripheral. In some cases, the I/O component 1735 may utilize an operating system such as iOS®, ANDROID®, MS-DOS®, MS-WINDOWS®, OS/2®, UNIX®, LINUX®, or another known operating system. In other cases, the I/O component 1735 may represent or interact with a modem, a keyboard, a mouse, a touchscreen, or a similar device. In some cases, the I/O component 1735 may be implemented as part of a processor. In some cases, a user may interact with the device 1705 via the I/O component 1735 or via hardware components controlled by the I/O component 1735. The I/O component 1735 may support accessing the memory cells 1720, including receiving information associated with the sensed logic state of one or more of the memory cells 1720, or providing information associated with writing a logic state of one or more of the memory cells 1720.

The peripheral components 1740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1745 may represent a device or signal external to the device 1705 that provides input to the device 1705 or its components. This may include a user interface or an interface with or between other devices. In some cases, the input 1745 may be managed by the I/O component 1735, and may interact with the device 1705 via a peripheral component 1740.

The output 1750 may represent a device or signal external to the device 1705 configured to receive output from the device 1705 or any of its components. Examples of the output 1750 may include a display, audio speakers, a printing device, another processor or printed circuit board, or other devices. In some cases, the output 1750 may be a peripheral element that interfaces with the device 1705 via the peripheral component(s) 1740. In some cases, the output 1750 may be managed by the I/O component 1735.

The components of the device 1705 may include circuitry designed to carry out their functions. This may include various circuit elements, for example, conductive lines, transistors, capacitors, inductors, resistors, amplifiers, or other active or inactive elements, configured to carry out the functions described herein. The device 1705 may be a computer, a server, a laptop computer, a notebook computer, a tablet computer, a mobile phone, a wearable electronic device, a personal electronic device, or the like. Or the device 1705 may be a portion or element of such a device.

Figure 18:
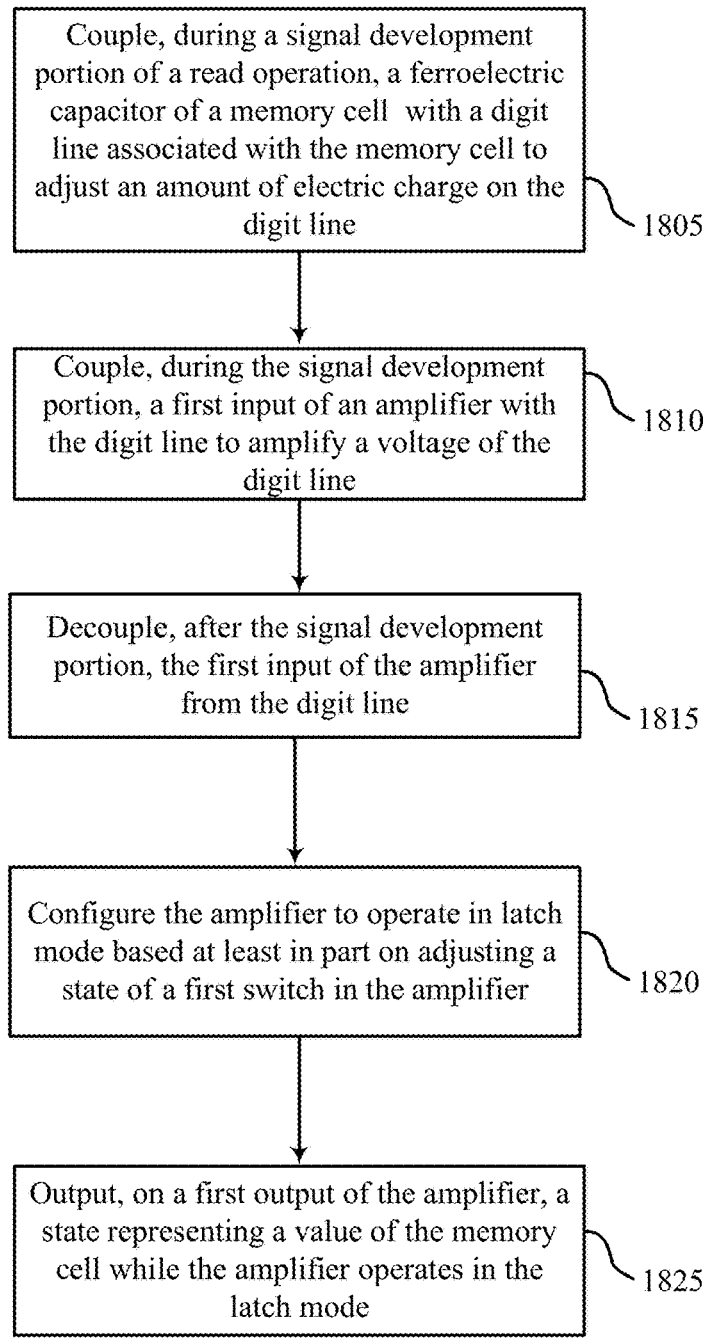
FIG. 18 shows a flowchart illustrating a method that may support sense amplifiers with lower offset and higher speed for sensing memory cells in accordance with various examples of the present disclosure.

FIG. 18 shows a flowchart illustrating a method 1800 that may support sense amplifiers with lower offset and higher speed for sensing memory cells in accordance with various examples of the present disclosure. The operations of method 1800 may be implemented by memory device 100, circuit 200, circuits 400-1000 and 1200-1400, memory device 1405, system 800, or their components as described herein. For example, operations of method 1800 may be performed at least in part by a memory controller as described with reference to FIGS. 1 through 17. In some examples, a memory device may execute a set of instructions to control the functional elements of the device (e.g., voltage supplies, logical signals, transistors, amplifier components, sense amplifiers, switching components, selection components) to perform the functions described below. Additionally or alternatively, the memory device may perform some or all of the functions described below using special-purpose hardware.

At 1805 the memory device may couple, during a signal development portion of a read operation of a memory cell (e.g., memory cell 105), a ferroelectric capacitor (e.g., capacitor 220) of the memory cell with a digit line (e.g., digit line 210) associated with the memory cell to adjust an amount of electric charge on the digit line. In some cases, the memory device may couple the ferroelectric capacitor with the digit line by activating one or more switching components (e.g., switching component 260-*d*), such as described with respect to FIGS. 4-14.

At 1810, the memory device may couple, during the signal development portion, a first input of an amplifier component (e.g., input 440 of amplifier component 410) with the digit line to amplify a voltage of the digit line. In some cases, the memory device may couple the first input of the amplifier component with the digit line by activating one or more switching components (e.g., switching component 260-*d*). In some cases, the amplifier component may amplify the voltage of the digit line by amplifying a difference between the voltage of the digit line and a sense voltage (e.g., from voltage source 235-*d*), such as described with respect to FIG. 8.

At 1815, the memory device may uncouple, after the signal development portion of the read operation, the first input of the amplifier component from the digit line. In some cases, the memory device may uncouple the first input of the amplifier component from the digit line by deactivating one or more switching components (e.g., switching component 260-*d*), such as described with respect to FIG. 9.

At 1820, the memory device may configure the amplifier component to operate in a latch mode based at least in part on activating or deactivating a first switching component (e.g., by activating switching component 510-*e*, 510-*f* and/or deactivating switching component 510-*d*, 510-*c*) in the amplifier component.

At 1825, the memory device may output, on a first output (e.g., on output 460) of the amplifier component, a state of the memory cell while the amplifier operates in the latch mode. In some cases, the memory device may output the state to a separate latch circuit (e.g., latch circuit 430), which stores the state. In some cases, the memory device may store the state using transistors within amplifier component (e.g., transistors 505-*a*, 505-*b*), and may output the state to other components of memory device.

Memory device 100 may perform some or all of the processes described above with respect to method 1800 using the circuitry and signals described with respect to FIGS. 1-17, for example.

It should be noted that the methods described above describe possible implementations, and that the operations and the steps may be rearranged or otherwise modified and that other implementations are possible. Further, examples from two or more of the methods may be combined.

An apparatus for performing the method 1800 is described. The apparatus may include means for coupling, during a signal development portion of a read operation of a memory cell, a ferroelectric capacitor of the memory cell with a digit line associated with the memory cell to adjust an amount of electric charge on the digit line; means for coupling, during the signal development portion, a first input of an amplifier component with the digit line to amplify a voltage of the digit line; means for decoupling, after the signal development portion of the read operation, the first input of the amplifier component from the digit line; means for configuring the amplifier component to operate in a latch mode based at least in part on activating or deactivating a first switching component in the amplifier component; and means for outputting, on a first output of the amplifier component, a state of the memory cell while the amplifier component operates in the latch mode.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. By way of example, two components may be coupled by activating or deactivating a switching component (e.g., a transistor) to enable electronic communication between the two components.

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switching component may be isolated from each other when the switching component is open or deactivated.

As used herein, the term "shorting" refers to a relationship between components in which a conductive path is established between the components via the activation of a single intermediary component between the two components in question. For example, a first component shorted to a second component may exchange electrons with the second component when a switching component between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

As used herein, the term "terminal" need not suggest a physical boundary or connection point of a circuit element. Rather, "terminal" may refer to a reference point of a circuit relevant to the circuit element, which may also be referred to as a "node" or "reference point."

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, such as a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
configuring an amplifier component to operate in an amplifier mode during a first pre-charging portion of a read operation based at least in part on activating or deactivating a second switching component in the amplifier component;
coupling, while the amplifier component is operating in the amplifier mode, a first voltage source with a first input of the amplifier component, a first output of the amplifier component with a second input of the amplifier component, and the first output of the amplifier component with a digit line to pre-charge the digit line to a first voltage during the first pre-charging portion of the read operation;
coupling, during a signal development portion of the read operation of a memory cell, a ferroelectric capacitor of the memory cell with the digit line associated with the memory cell to adjust an amount of electric charge on the digit line;

coupling, during the signal development portion, the first input of the amplifier component with the digit line to amplify a voltage of the digit line;

decoupling, after the signal development portion of the read operation, the first input of the amplifier component from the digit line;

configuring the amplifier component to operate in a latch mode based at least in part on activating or deactivating a first switching component in the amplifier component; and outputting, on the first output of the amplifier component, a state of the memory cell while the amplifier component operates in the latch mode, wherein the first pre-charging portion of the read operation occurs before the signal development portion of the read operation.

2. The method of claim 1, further comprising:

coupling, during a second pre-charging portion of the read operation, a second voltage source with the digit line to adjust the voltage of the digit line to a second voltage; and decoupling the second voltage source from the digit line after the voltage of the digit line has been adjusted to the second voltage during the second pre-charging portion, wherein the second pre-charging portion occurs before the first pre-charging portion.

3. The method of claim 1, further comprising:

configuring the amplifier component to operate in the amplifier mode at least in part by activating or deactivating a third switching component in the amplifier component before coupling the first input of the amplifier component to the digit line during the signal development portion of the read operation, wherein configuring the amplifier component to operate in the amplifier mode comprises configuring the amplifier component to amplify a difference between a predetermined voltage supplied by the first voltage source and the voltage of the digit line.

4. The method of claim 1, wherein configuring the amplifier component to operate in the amplifier mode during the first pre-charging portion of the read operation comprises configuring the amplifier component to generate the first voltage based at least in part on a predetermined voltage and a voltage offset of the amplifier.

5. The method of claim 1, wherein configuring the amplifier component to operate in the amplifier mode comprises configuring first and second transistors in the amplifier component to operate as a current mirror based at least in part on coupling a gate of a first transistor in the amplifier component to a gate of a second transistor in the amplifier component.

6. The method of claim 3, further comprising:

coupling, during the signal development portion, a second output of the amplifier component to an amplifier capacitor that is coupled with the digit line, wherein operating the amplifier component in the amplifier mode during the signal development portion comprises integrating the amount of electric charge on the digit line using the amplifier component and the amplifier capacitor.

7. The method of claim 6, wherein configuring the amplifier component to operate in the latch mode comprises:

decoupling the second output of the amplifier component from the amplifier capacitor; and coupling the second input of the amplifier component to the amplifier capacitor, wherein operating the amplifier component in the latch mode comprises the amplifier component determining the state based at least in part on a comparison of a voltage of the amplifier capacitor with a reference voltage and latching the state.

8. The method of claim 7, wherein the amplifier component latches the state by storing the state using a plurality of transistors in the amplifier component, and wherein the amplifier component amplifies the voltage of the digit line using at least some of the plurality of transistors.

9. The method of claim 7, wherein the state may be a first state or a second state, wherein the amplifier component latches the first state by storing the first state using a plurality of transistors in the amplifier component, and wherein the amplifier component latches the second state by providing the second state to a separate latch circuit coupled with the amplifier component.

10. An apparatus, comprising:

an amplifier capacitor coupled with a digit line associated with a memory cell; and an amplifier component configured to be selectively coupled with the digit line and with the amplifier capacitor, the amplifier component comprising:

a plurality of transistors, and a plurality of switching components configured to select a mode of the amplifier component by activating one or more electrical connections between respective transistors, the plurality of switching components configured to select the mode as an amplifier mode that configures the amplifier component to, while an input of the amplifier component is coupled with the digit line and an output of the amplifier component is coupled with the amplifier capacitor, adjust a voltage of the amplifier capacitor, and the plurality of switching components configured to select the mode as a latch mode that configures the amplifier component to latch a state of the memory cell in response to an activation signal, wherein the plurality of switching components are configured to select the mode as the amplifier mode which configures a first transistor of the plurality of transistors and a second transistor of the plurality of transistors to operate in a current mirror mode by activating an electrical connection between a gate of the first transistor and a gate of the second transistor.

11. The apparatus of claim 10, wherein the plurality of switching components are configured to select the mode as the latch mode which configures the amplifier component to determine, while a first input of the amplifier component is coupled with the amplifier capacitor, the state based on a comparison of the voltage of the amplifier capacitor with a reference voltage.

12. The apparatus of claim 10, wherein the plurality of switching components are configured to select the mode as the latch mode by deactivating the electrical connection between the gate of the first transistor of the plurality of transistors and the gate of the second transistor of the plurality of transistors.

13. The apparatus of claim 11, wherein the amplifier component is configured to latch the state by storing the state in the amplifier component using at least some of the plurality of transistors.

14. The apparatus of claim 11, further comprising:

a latch circuit configured to be selectively coupled with a first output of the amplifier component and to store the state, wherein the amplifier component is configured to latch the state, based at least in part on the determination of the state, by providing the state to the latch circuit.

15. The apparatus of claim 10, wherein when the plurality of switching components are configured to select the mode as the amplifier mode, the amplifier component is configured to adjust the voltage of the amplifier capacitor by amplifying a difference between a voltage of the digit line and a predetermined voltage using a set of transistors of the plurality of transistors, and wherein when the plurality of switching components are configured to select the mode as the latch mode the amplifier component is configured to latch the state using at least some of the set of transistors.

16. A memory device, comprising:
a memory cell;
a digit line configured to be selectively coupled with the memory cell;
an amplifier component configured to be selectively coupled with the digit line;
a controller to:
couple, during a first portion of a read operation of the memory cell, the amplifier component to the digit line;
couple, during the first portion, a ferroelectric capacitor of the memory cell with the digit line to adjust an amount of electric charge on the digit line;
decouple the amplifier component from the digit line after the first portion of the read operation;
configure the amplifier component to operate in a latch mode based at least in part on configuring a plurality of switching components in the amplifier component;
cause a state of the memory cell to be latched while the amplifier component is configured to operate in the latch mode;
configure the amplifier component to operate in an amplifier mode during a second portion of the read operation based at least in part on configuring the plurality of switching components in the amplifier component; and
couple, while the amplifier component is operating in the amplifier mode, a first input of the amplifier component with a second voltage source and an output of the amplifier component with the digit line to pre-charge the digit line to a first voltage during the second portion of the read operation,
wherein the second portion of the read operation occurs before the first portion of the read operation.

17. The memory device of claim 16, further comprising:
an amplifier capacitor coupled with the digit line and configured to be selectively coupled with the amplifier component,
wherein the controller is configured to configure the amplifier component to operate in the latch mode based at least in part on coupling the first input of the amplifier component to the amplifier capacitor and coupling a second input of the amplifier component to a first voltage source, and
wherein the controller is configured to cause the state to be latched based at least in part on activating the amplifier component while it is configured in the latch mode.

18. The memory device of claim 17, wherein the amplifier component is configured to determine, while the amplifier component is configured in the latch mode, the state based at least in part on a comparison of a voltage of the amplifier capacitor with a voltage of the first voltage source.

19. The memory device of claim 16, wherein the controller is further configured to:
during the first portion of the read operation: couple the first input of the amplifier component with a third voltage source; and couple the second input of the amplifier component with the digit line, wherein configuring the amplifier component to operate in the amplifier mode configures the amplifier component to, during the first portion of the read operation, amplify a difference between a voltage of the third voltage source and a voltage of the digit line.

20. The memory device of claim 19, wherein the controller causes the state to be latched based at least in part on activating the amplifier component while it is configured in the latch mode, which configures the amplifier component to latch the state using a plurality of transistors in the amplifier component, and wherein the amplifier component is configured to amplify the difference between the voltage of the third voltage source and the voltage of the digit line using at least some of the plurality of transistors.

21. The memory device of claim 16, wherein the first portion comprises a signal development portion of the read operation.

22. The memory device of claim 16, wherein the second portion comprises a pre-charging portion of the read operation.

* * * * *